United States Patent
Yuan et al.

(10) Patent No.: US 10,825,413 B2
(45) Date of Patent: Nov. 3, 2020

(54) SHIFT REGISTER CIRCUIT, GATE DRIVING CIRCUIT AND METHOD FOR DRIVING THE SAME, AND DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/523,215

(22) Filed: Jul. 26, 2019

(65) Prior Publication Data
US 2020/0184872 A1 Jun. 11, 2020

(30) Foreign Application Priority Data
Dec. 7, 2018 (CN) .......................... 2018 1 1500593

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G11C 19/287* (2013.01); *G09G 2310/0286* (2013.01); *G09G 2310/08* (2013.01)

(58) Field of Classification Search
CPC ......... G09G 2310/0286; G09G 3/3674; G09G 3/3677; G11C 19/00–38
See application file for complete search history.

(56) References Cited

U.S. PATENT DOCUMENTS 9,495,920 B2 * 11/2016 Yang ..................... G09G 3/3677
2014/0050294 A1 * 2/2014 Cao ......................... G11C 19/28
377/54

(Continued)

*Primary Examiner* — Gene W Lee
(74) *Attorney, Agent, or Firm* — Kinney & Lange, P.A.

(57) ABSTRACT

A shift register circuit, a gate driving circuit and a method for driving the same, and a display apparatus are disclosed. The shift register circuit includes: an input circuit configured to receive an input signal and output the input signal to a pull-up node; an output circuit configured to receive a clock signal and provide an output signal at a signal output terminal based on the clock signal under control of a level at the pull-up node; a pull-down circuit configured to pull down a level at the signal output terminal under control of a level at a pull-down node; and at least one of a feedback circuit or a pull-down control circuit, wherein the feedback circuit is electrically coupled to the pull-up node, and is configured to output a first feedback signal based on the level at the pull-up node; and the pull-down control circuit is electrically coupled to the pull-up node and the pull-down node, and is configured to receive a second feedback signal and control the level at the pull-down node under control of the level at the pull-up node and the second feedback signal.

20 Claims, 14 Drawing Sheets

(56) References Cited

U.S. PATENT DOCUMENTS

| | | | |
|---|---|---|---|
| 2017/0039971 A1* | 2/2017 | Huang | G11C 19/184 |
| 2018/0190232 A1* | 7/2018 | Xue | G09G 3/3677 |
| 2018/0204628 A1* | 7/2018 | Gao | G11C 7/02 |
| 2018/0275804 A1* | 9/2018 | Huang | G06F 3/044 |
| 2018/0286490 A1* | 10/2018 | Sun | G09G 5/10 |
| 2018/0342187 A1* | 11/2018 | Shan | G11C 19/287 |

\* cited by examiner

SHIFT REGISTER CIRCUIT, GATE DRIVING CIRCUIT AND METHOD FOR DRIVING THE SAME, AND DISPLAY APPARATUS

CROSS-REFERENCE TO RELATED APPLICATION(S)

This application claims priority to the Chinese Patent Application No. CN201811500593.2, filed on Dec. 7, 2018, entitled "SHIFT REGISTER UNIT, GATE DRIVING CIRCUIT AND METHOD FOR DRIVING THE SAME, AND DISPLAY APPARATUS", which is incorporated herein by reference in its entirety.

TECHNICAL FIELD

The present disclosure relates to the field of display, and more particularly, to a shift register circuit, a gate driving circuit and a method for driving the same, and a display apparatus.

BACKGROUND

In a Thin Film Transistor (TFT)-based display, a gate driving circuit may be formed on a display panel to form a Gate Drive On Array (GOA) panel. The gate driving circuit comprises a plurality of cascaded shift register circuits. In a conventional gate driving circuit, an output signal of a shift register circuit at a next stage is usually used as a reset signal of a shift register circuit at a current stage, and an output signal of a shift register circuit at a previous stage is usually used as an input signal of the shift register circuit at the current stage. With the development of technology, a structural design of the gate driving circuit is more and more complicated. However, there is a limited space on a GOA panel in a display device, especially in a display device with high Pixels Per Inch (PPI), and therefore it is difficult to provide a complicated gate driving circuit in the limited space.

SUMMARY

According to an aspect of the embodiments of the present disclosure, there is provided a shift register circuit, comprising:
an input circuit electrically coupled to a pull-up node of the shift register circuit, and configured to receive an input signal and output the input signal to the pull-up node;
an output circuit electrically coupled to a signal output terminal and the pull-up node of the shift register circuit, and configured to receive a clock signal and provide an output signal at the signal output terminal based on the clock signal under control of a level at the pull-up node;
a pull-down circuit electrically coupled to the signal output terminal and a pull-down node of the shift register circuit, and configured to pull down a level at the signal output terminal under control of a level at the pull-down node; and
at least one of a feedback circuit or a pull-down control circuit, wherein
the feedback circuit is electrically coupled to the pull-up node, and is configured to output a first feedback signal based on the level at the pull-up node; and
the pull-down control circuit is electrically coupled to the pull-up node and the pull-down node, and is configured to receive a second feedback signal and control the level at the pull-down node under control of the level at the pull-up node and the second feedback signal.

In an example, the pull-down control circuit comprises:
a first control sub-circuit electrically coupled to the pull-up node and the pull-down node, and configured to control the level at the pull-down node under control of the level at the pull-up node; and
a second control sub-circuit electrically coupled to the first control sub-circuit, wherein the second control sub-circuit has a feedback input terminal configured to receive the second feedback signal, and is configured to receive the second feedback signal at the feedback input terminal and control turn-on and turn-off of the first control sub-circuit according to the second feedback signal.

In an example, the feedback circuit comprises:
a feedback sub-circuit electrically coupled to the pull-up node, wherein the feedback sub-circuit has a feedback output terminal configured to output the first feedback signal, and is configured to generate the first feedback signal based on the level at the pull-up node and output the first feedback signal at the feedback output terminal;
a first pull-down sub-circuit electrically coupled to the feedback sub-circuit and the pull-down node, and configured to pull down the first feedback signal generated by the feedback sub-circuit under control of the level at the pull-down node; and
a second pull-down sub-circuit electrically coupled to the pull-up node and the pull-down node, and configured to pull down the level at the pull-up node under control of the level at the pull-down node.

In an example, the feedback circuit further comprises a third pull-down sub-circuit, wherein the second pull-down sub-circuit is electrically coupled to a reference signal terminal configured to provide a reference signal through the third pull-down sub-circuit, and the third pull-down sub-circuit is electrically coupled to the pull-down node, and is configured to pull down a level at a node between the third pull-down sub-circuit and the second pull-down sub-circuit under control of the level at the pull-down node; and
the feedback output terminal is electrically coupled to the node between the third pull-down sub-circuit and the second pull-down sub-circuit.

In an example, the shift register circuit comprises one of the feedback circuit or the pull-down control circuit, and the pull-down node comprises a first pull-down node.

In an example, the shift register circuit comprises the feedback circuit and the pull-down control circuit;
the pull-down node comprises a first pull-down node and a second pull-down node;
the pull-down circuit is electrically coupled to the signal output terminal, the first pull-down node and the second pull-down node, and is configured to pull down the level at the signal output terminal under control of levels at the first pull-down node and the second pull-down node; and
the pull-down control circuit is electrically coupled to the pull-up node and the first pull-down node, and is configured to receive the second feedback signal and control the level at the first pull-down node under control of the level at the pull-up node and the second feedback signal.

In an example, in a case where the pull-down control circuit comprises a first control sub-circuit and a second control sub-circuit,
the first control sub-circuit comprises a first transistor, a second transistor, a third transistor, a fourth transistor and a capacitor, wherein
the first transistor has a gate electrically coupled to a power supply signal terminal configured to provide a power supply signal, a first electrode electrically coupled to the gate, and a second electrode electrically coupled to a gate of the second transistor;

the second transistor has the gate electrically coupled to the second electrode of the first transistor, a first electrode electrically coupled to the power supply signal terminal, and a second electrode electrically coupled to the first pull-down node;

the third transistor has a gate electrically coupled to the pull-up node, a first electrode electrically coupled to the second electrode of the second transistor, and a second electrode electrically coupled to a reference signal terminal configured to provide a reference signal;

the fourth transistor has a gate electrically coupled to the pull-up node, a first electrode electrically coupled to the second electrode of the first transistor, and a second electrode electrically coupled to the reference signal terminal; and the capacitor is electrically coupled between the gate and the second electrode of the second transistor, and the second control sub-circuit comprises a fifth transistor wherein the fifth transistor has a gate electrically coupled to the feedback input terminal, a first electrode electrically coupled to the second electrode of the first transistor, and a second electrode electrically coupled to the reference signal terminal.

In an example, in a case where the feedback circuit comprises a feedback sub-circuit, a first pull-down sub-circuit, and a second pull-down sub-circuit, the feedback sub-circuit comprises a sixth transistor and a seventh transistor, wherein the sixth transistor has a gate electrically coupled to the pull-up node, a first electrode electrically coupled to a power supply signal terminal configured to provide a power supply signal, and a second electrode electrically coupled to a gate of the seventh transistor, and the seventh transistor has the gate electrically coupled to a first electrode thereof, and a second electrode electrically coupled to a feedback output terminal;

the first pull-down sub-circuit comprises an eighth transistor and an eleventh transistor, wherein the eighth transistor has a gate electrically coupled to the first pull-down node, a first electrode electrically coupled to the second electrode of the sixth transistor, and a second electrode electrically coupled to a reference signal terminal configured to provide a reference signal, and the eleventh transistor has a gate electrically coupled to the second pull-down node, a first electrode electrically coupled to the second electrode of the sixth transistor, and a second electrode electrically coupled to the reference signal terminal; and the second pull-down sub-circuit comprises a ninth transistor and a twelfth transistor, wherein the ninth transistor has a gate electrically coupled to the first pull-down node, a first electrode electrically coupled to the pull-up node, and a second electrode electrically coupled to the reference signal terminal, and the twelfth transistor has a gate electrically coupled to the second pull-down node, a first electrode electrically coupled to the pull-up node, and a second electrode electrically coupled to the reference signal terminal.

In an example, in a case where the feedback circuit further comprises a third pull-down sub-circuit, the third pull-down sub-circuit comprises a tenth transistor and a thirteenth transistor, wherein the tenth transistor has a gate electrically coupled to the first pull-down node, a first electrode electrically coupled to the second electrode of the ninth transistor and the feedback output terminal, and a second electrode electrically coupled to the reference signal terminal; and the thirteenth transistor has a gate electrically coupled to the second pull-down node, a first electrode electrically coupled to the second electrode of the twelfth transistor and the feedback output terminal, and a second electrode electrically coupled to the reference signal terminal.

In an example, the input circuit comprises a fourteenth transistor and a fifteenth transistor, wherein the fourteenth transistor has a gate and a first electrode electrically coupled to a signal input terminal configured to provide an input signal, and a second electrode electrically coupled to a first electrode of the fifteenth transistor, and the fifteenth transistor has a gate electrically coupled to the gate of the fourteenth transistor, the first electrode electrically coupled to the second electrode of the fourteenth transistor, and a second electrode electrically coupled to the pull-up node; and the feedback output terminal is electrically coupled to the second electrode of the fourteenth transistor and the first electrode of the fifteenth transistor.

In an example, the shift register circuit further comprises: a reset circuit comprising a sixteenth transistor and a seventeenth transistor, wherein the sixteenth transistor has a gate electrically coupled to a reset signal terminal configured to provide a reset signal, a first electrode electrically coupled to the pull-up node, and a second electrode electrically coupled to a first electrode of the seventeenth transistor;

the seventeenth transistor has a gate electrically coupled to the reset signal terminal, the first electrode electrically coupled to the second electrode of the sixteenth transistor, and a second electrode electrically coupled to the reference signal terminal; and the feedback output terminal is electrically coupled to the second electrode of the sixteenth transistor and the first electrode of the seventeenth transistor.

According to another aspect of the embodiments of the present disclosure, there is provided a gate driving circuit, comprising cascaded shift register circuits at N stages described above, wherein the shift register circuit at the $n^{th}$ stage receives an output signal from the shift register circuit at the $(n-1)^{th}$ stage as an input signal, and receives an output signal from the shift register circuit at the $(n+2)^{th}$ stage as a reset signal, where n and N are integers, $N \geq 4$, and $2 \leq n < N-2$;

for each shift register circuit having a pull-down control circuit, the shift register circuit at its next stage has a feedback circuit, and the shift register circuit having the pull-down control circuit receives a first feedback signal output from the feedback circuit of the shift register circuit at its next stage as a second feedback signal; and a pull-down node of the shift register circuit having the pull-down control circuit is electrically coupled to a pull-down node of the shift register circuit at its previous or next stage to form a group of shift register circuits.

In an example, the pull-down node comprises a first node; and one shift register circuit from the group of shift register circuits comprises a pull-down control circuit, and the other shift register circuit from the group of shift register circuits comprises a feedback circuit.

In an example, the pull-down node comprises a first node and a second node; each shift register circuit from the group of shift register circuits comprises a pull-down control circuit and a feedback circuit; and a first pull-down node of one shift register circuit from the group of shift register circuits is electrically coupled to a second pull-down node of the other shift register circuit from the group of shift register circuits, and a second pull-down node of the one shift register circuit from the group of shift register circuits is electrically coupled to a first pull-down node of the other shift register circuit from the group of shift register circuits.

In an example, a pull-down control circuit of one shift register circuit from the group of shift register circuits is configured to be powered by a first power supply signal, and a pull-down control circuit of the other shift register circuit from the group of shift register circuits is configured to be powered by a second power supply signal which is inverted to the first power supply signal.

In an example, the shift register circuit having the feedback circuit has a feedback output terminal configured to output the first feedback signal, and the gate driving circuit further comprises a connection component provided between the feedback output terminal and the pull-up node of the shift register circuit, and configured to electrically couple the feedback output terminal to the pull-up node in a first state, and electrically decouple the feedback output terminal from the pull-up node in a second state.

In an example, the connection component comprises a pad which is able to be electrically coupled by laser breakdown.

According to yet another aspect of the embodiments of the present disclosure, there is provided a display apparatus, comprising the gate driving circuit described above.

According to a further aspect of the embodiments of the present disclosure, there is provided a method for driving the gate driving circuit described above, comprising: providing power to pull-down control circuits and/or feedback circuits of the shift register circuits in the gate driving circuit, and provide clock signals to the shift register circuits.

In an example, in a case where the pull-down node comprises a first node and a second node and each shift register circuit in the group of shift register circuits comprises a pull-down control circuit and a feedback circuit, the providing power to the pull-down control circuits of the shift register circuits comprises:
providing a first power supply signal to a pull-down control circuit of one shift register circuit from the group of shift register circuits, and providing a second power supply signal to a pull-down control circuit of the other shift register circuit from the group of shift register circuits, wherein
in a first time period, the first power supply signal is at a first level, and the second power supply signal is at a second level; and
in a second time period, the first power supply signal is at the second level, and the second power supply signal is at the first level.

DETAILED DESCRIPTION

Figure 1A:
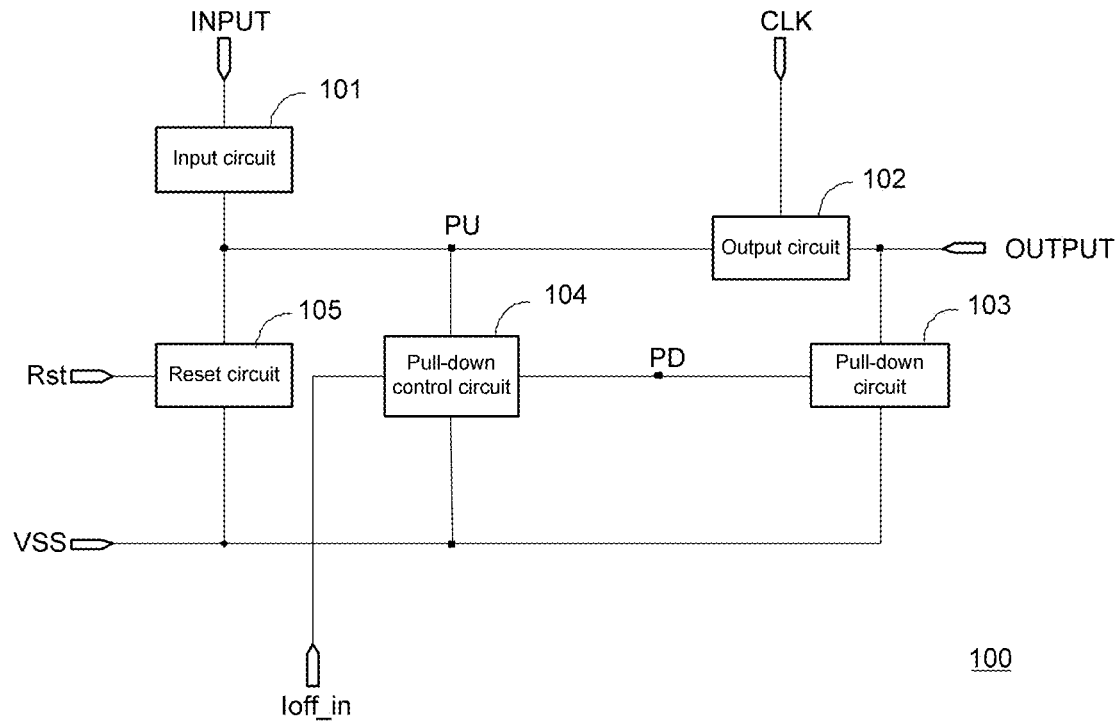
FIG. 1A illustrates a schematic block diagram of a shift register circuit according to an embodiment of the present disclosure.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or configuration will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "coupled with" or "coupled to" may mean that two components are directly connected, or that two components are connected via one or more other components. In addition, the two components may be connected or coupled by wire or wirelessly.

In addition, in the description of the embodiments of the present disclosure, the terms "first level" and "second level" are only used to distinguish magnitudes of the two levels from each other. For example, the following description is made by taking the "first level" being a low level and the "second level" being a high level as an example. It may be understood by those skilled in the art that the present disclosure is not limited thereto.

The transistors used in the embodiments of the present disclosure may each be a thin film transistor or a field effect transistor or other devices having the same characteristics. The thin film transistor used in the embodiments of the present disclosure may be an oxide semiconductor transistor. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following examples, the description is made by taking an N-type thin film transistor as an example. It may be understood by those skilled in the art that the embodiments of the present disclosure may obviously applied to a case of a P-type thin film transistor.

A register circuit according to an embodiment of the present disclosure will be described below with reference to FIGS. 1A and 1B.

FIG. 1A illustrates a schematic block diagram of a shift register circuit according to an embodiment of the present disclosure. As shown in FIG. 1A, the shift register circuit 100 comprises an input circuit 101, an output circuit 102, a pull-down circuit 103, and a pull-down control circuit 104.

The input circuit 101 is coupled to a pull-up node PU of the shift register circuit 100. The input circuit 101 may receive an input signal, for example, from an input signal terminal INPUT and output the input signal to the pull-up node PU.

The output circuit 102 is coupled to a signal output terminal OUTPUT and the pull-up node PU of the shift register circuit 100. The output circuit 102 may receive a clock signal, for example, from a clock signal terminal CLK and provide an output signal at the signal output terminal OUTPUT based on the clock signal under control of a level at the pull-up node PU.

The pull-down circuit 103 is coupled to the signal output terminal OUTPUT and a pull-down node PD of the shift register circuit 100. The pull-down circuit 103 may pull down a level at the signal output terminal OUTPUT under control of a level at the pull-down node PD.

The pull-down control circuit 104 is coupled to the pull-up node PU and the pull-down node PD. The pull-down control circuit 104 may receive a second feedback signal, for example, at a feedback input terminal Ioff_in, and control the level at the pull-down node PD under control of the level at the pull-up node PU and the second feedback signal.

The shift register circuit 100 may further comprise a reset circuit 105 coupled to the pull-up node PU and configured to reset the pull-up node PU under control of a reset signal. For example, the reset circuit 105 may be coupled to a reset signal terminal Rst configured to provide the reset signal, the pull-up node PU, and a reference signal terminal VSS configured to provide a reference signal, and the reset circuit 105 may reset the pull-up node PU under control of the reset signal received at the reset signal terminal Rst.

Figure 1B:
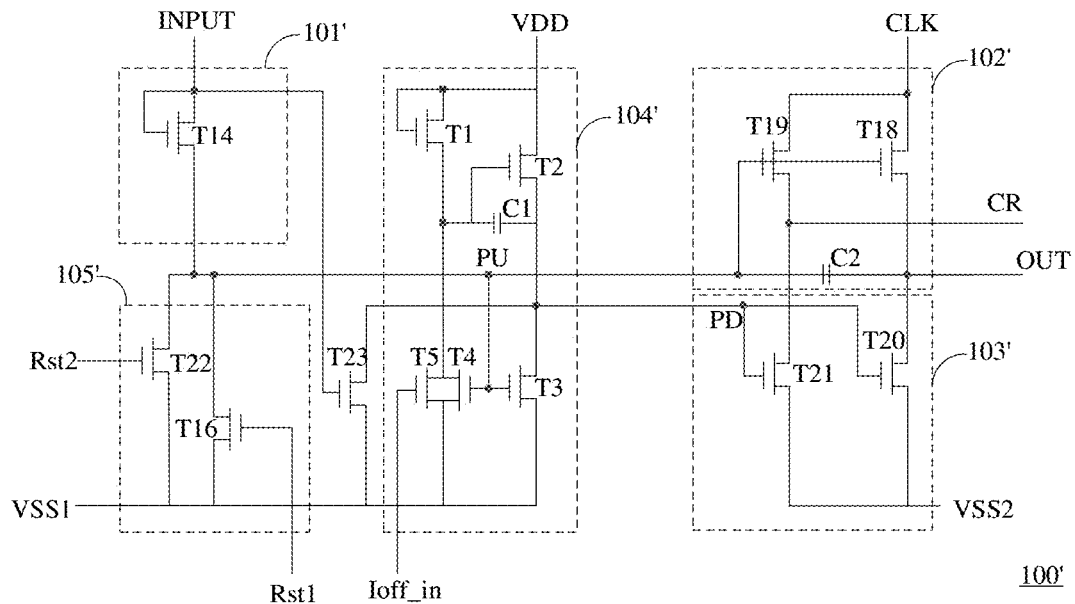
FIG. 1B illustrates a circuit diagram of an example of the shift register circuit of FIG. 1A.

FIG. 1B illustrates a circuit diagram of an example of the shift register circuit of FIG. 1A. As shown in FIG. 1B, the shift register circuit 100' comprises an input circuit 101', an output circuit 102', a pull-down circuit 103', and a pull-down control circuit 104'.

The input circuit 101' may comprise a transistor T14 having a gate and a first electrode coupled to the signal input terminal INPUT to receive an input signal, and a second electrode coupled to the pull-up node PU.

The output circuit 102' may comprise a transistor T18 and a capacitor C2, wherein the transistor T18 has a gate coupled to the pull-up node PU, a first electrode coupled to the clock signal terminal CLK to receive the clock signal, and a second electrode coupled to a first signal output terminal OUT to provide a first output signal. The capacitor C2 is coupled between the gate and the second electrode of the transistor T18. The output circuit 102 may further comprise a transistor T19 having a gate coupled to the pull-up node PU, a first electrode coupled to the clock signal terminal CLK to receive the clock signal, and a second electrode coupled to a second signal output terminal CR to provide a second output signal.

The pull-down circuit 103' comprises transistors T20 and T21. The transistor T20 has a gate coupled to the pull-down node PD, a first electrode coupled to the first signal output terminal OUT, and a second electrode coupled to a second reference signal terminal VSS2. The transistor T21 has a gate coupled to the pull-down node PD, a first electrode coupled to the second signal output terminal CR, and a second electrode coupled to the second reference signal terminal VSS2.

The pull-down control circuit 104' comprises a first control sub-circuit and a second control sub-circuit. The first control sub-circuit is coupled to the pull-up node PU and the pull-down node PD, and is configured to control the level at the pull-down node PD under control of the level at the pull-up node PU. The second control sub-circuit is coupled to the first control sub-circuit, has a feedback input terminal Ioff_in configured to receive the second feedback signal, and is configured to receive the second feedback signal at the feedback input terminal Ioff_in and control turn-on and turn-off of the first control sub-circuit according to the second feedback signal. In the example of FIG. 1B, the first control sub-circuit comprises transistors T1, T2, T3, and T4 and a capacitor C1, and the second control sub-circuit comprises a transistor T5. The transistor T1 has a gate, for example, coupled to a power supply signal terminal VDD to receive a power supply signal, a first electrode coupled to the gate thereof, and a second electrode coupled to a gate of the transistor T2. The transistor T2 has a gate coupled to the second electrode of the transistor T1, a first electrode coupled to the power supply signal terminal VDD to receive the power supply signal, and a second electrode coupled to the pull-down node PD. The transistor T3 has a gate coupled to the pull-up node PU, a first electrode coupled to the second electrode of the transistor T2, and a second electrode coupled to a first reference signal terminal VSS1. The transistor T4 has a gate coupled to the pull-up node PU, a first electrode coupled to the second electrode of the transistor T1, and a second electrode coupled to the first reference signal terminal VSS1. The capacitor C1 is coupled between the gate and the second electrode of the transistor T2. The transistor T5 has a gate, for example, coupled to the feedback input terminal Ioff_in to receive the second feedback signal, a first electrode coupled to the second electrode of the transistor T1, and a second electrode coupled to the first reference signal terminal VSS1.

For example, when the second feedback signal received at the feedback input terminal Ioff_in is at a low level, the transistor T5 is turned off, and the first control sub-circuit is turned on. At this time, if the pull-up node PU is at a high level, the transistors T3 and T4 are turned on, to pull down the pull-down node PD to a low level; and if the pull-up node is at a low level, the transistors T3 and T4 are turned off, and since the transistor T5 is also in a turn-off state and the transistors T1 and T2 are turned on due to a high level at the power supply signal terminal VDD at this time, the pull-down node PD is at a high level. When the second feedback signal received at the feedback input terminal Ioff_in is at a high level, the transistor T5 is turned on, the second electrode of the transistor T1 is pulled down to a low level, the transistor T2 is turned off, and the first control sub-circuit is turned off. At this time, regardless of whether the pull-up node PU is at a high level or a low level, a voltage at the pull-down node PD does not change accordingly.

Also with reference to FIG. 1B, the shift register circuit 100' may further comprise a reset circuit 105'. The reset circuit 105' comprises a transistor T16 having a gate coupled to a first reset signal terminal Rst1 to receive a first reset signal, a first electrode coupled to the pull-up node PU, and a second electrode coupled to the first reference signal terminal VSS1. The reset circuit 105' may further comprise a transistor T22 having a gate coupled to a second reset signal terminal Rst2 to receive a second reset signal, a first electrode coupled to the pull-up node PU, and a second electrode coupled to the first reference signal terminal VSS1.

In FIG. 1B, the input circuit 101' may further comprise a control sub-circuit configured to control the level at the pull-down node PD according to the input signal. In FIG. 1B, the control sub-circuit comprises a transistor T23 having a gate, for example, coupled to the signal input terminal INPUT to receive the input signal, a first electrode coupled to the pull-down node PD, and a second electrode coupled to the first reference signal terminal VSS1.

In FIG. 1B, the shift register circuit 100' comprises the two reset signal terminals Rst1 and Rst2 configured to receive the first reset signal and the second reset signal respectively. For example, the first reset signal may be a reset signal provided by another shift register circuit in a gate driving circuit, and the second reset signal may be a frame reset signal. In FIG. 1B, the shift register circuit 100' comprises the two reference signal terminals VSS1 and VSS2, wherein the first reference signal terminal VSS1 may be used to provide the first reference signal VGL, and the second reference signal terminal VSS2 may be used to provide the second reference signal LVGL different from the first reference signal. Of course, it should be apparent to those skilled in the art that the reference signal terminals VSS1 and VSS2 may also be implemented as one reference signal terminal to provide the same reference signal. In FIG. 1B, the shift register circuit 100' comprises the two signal output terminals OUT and CR, wherein the first signal output terminal OUT may be used to provide the first output signal as a gate driving signal, and the second signal output terminal CR may be used to provide the second output signal to control another shift register circuit in the gate driving circuit.

A shift register circuit according to another embodiment of the present disclosure will be described below with reference to FIGS. 2A, 2B, and 2C.

Figure 2A:
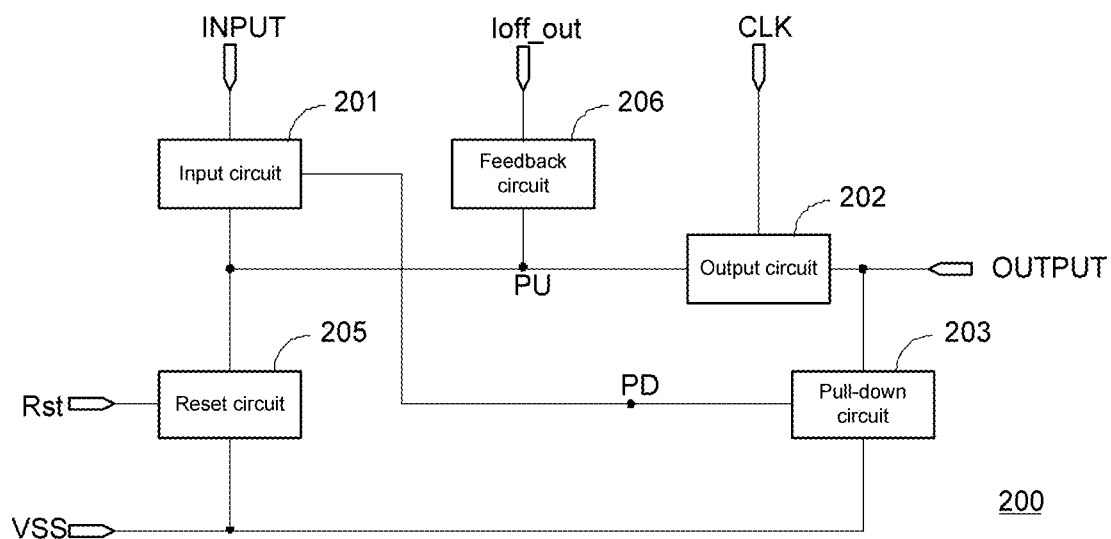
FIG. 2A illustrates a schematic block diagram of a shift register circuit according to another embodiment of the present disclosure.
Figure 2B:
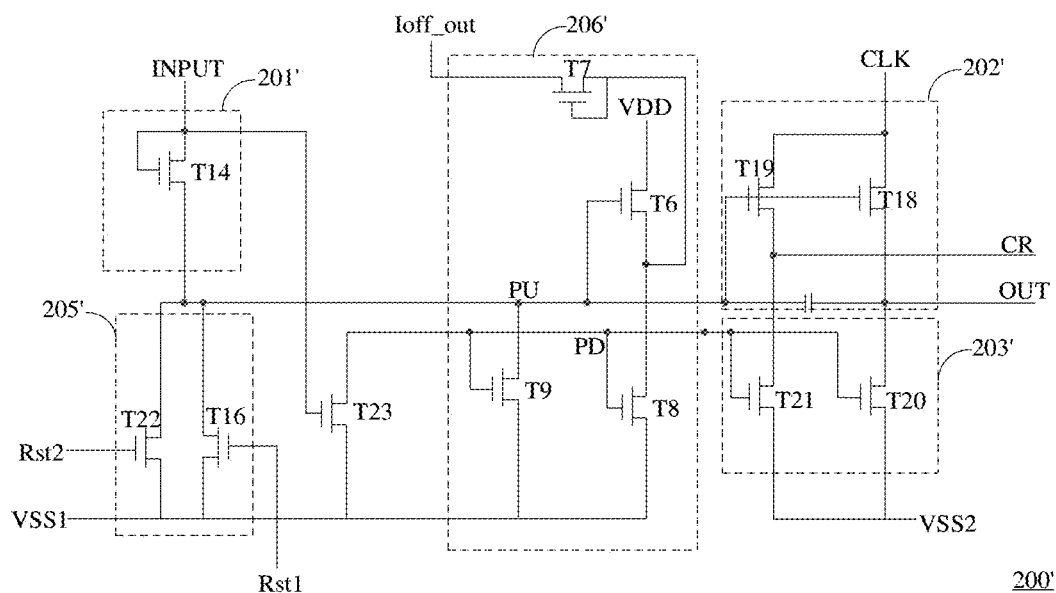
FIG. 2B illustrates a circuit diagram of an example of the shift register circuit of FIG. 2A.
Figure 2C:
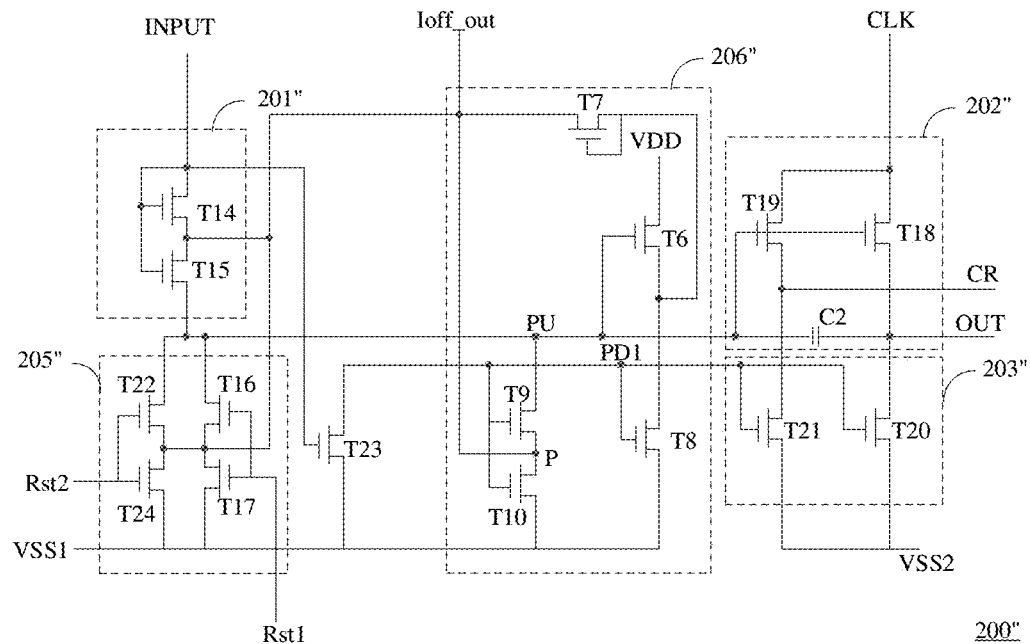
FIG. 2C illustrates a circuit diagram of another example of the shift register circuit of FIG. 2A.

The shift register circuits of FIGS. 2A, 2B, and 2C are similar to those of FIGS. 1A and 1B, except at least that the shift register circuits of FIGS. 2A, 2B, and 2C comprise a feedback circuit, but do not comprise a pull-down control circuit. For the sake of brevity, only the differences will be primarily described in detail below.

FIG. 2A illustrates a schematic block diagram of a shift register circuit according to another embodiment of the present disclosure. As shown in FIG. 2A, the shift register circuit 200 comprises an input circuit 201, an output circuit 202, and a pull-down circuit 203.

The input circuit 201 is coupled to a pull-up node PU of the shift register circuit 200. The input circuit 201 may receive an input signal, for example, from a signal input terminal INPUT and output the input signal to the pull-up node PU.

The output circuit 202 is coupled to a signal output terminal OUTPUT and the pull-up node PU of the shift register circuit 200. The output circuit 202 may receive a clock signal, for example, from a clock signal terminal CLK and provide an output signal at the signal output terminal OUTPUT based on the clock signal under control of a level at the pull-up node PU.

The pull-down circuit 203 is coupled to the signal output terminal OUTPUT and a pull-down node PD of the shift register circuit 200. The pull-down circuit 203 may pull down a level at the signal output terminal OUTPUT under control of the level at the pull-down node PD. The level at the pull-down node PD may be controlled by another shift register circuit. In some embodiments, the level at the pull-down node PD may also be controlled by the input circuit 201, for example, a control sub-circuit (for example, the transistor T23 described above) configured to pull down the level at the pull-down node PD according to the input signal may be provided in the input circuit 201 as described above.

The shift register circuit 200 may further comprise a reset circuit 205 coupled to the pull-up node PU and configured to reset the pull-up node PU under control of a reset signal. For example, the reset circuit 205 may be coupled to a reset signal terminal Rst configured to provide the reset signal, the pull-up node PU, and a reference signal terminal VSS configured to provide a reference signal, and the reset circuit 205 may reset the pull-up node PU under control of the reset signal received at the reset signal terminal Rst.

The shift register circuit 200 of FIG. 2A may further comprise a feedback circuit 206 coupled to the pull-up node PU, and may output a first feedback signal based on the level at the pull-up node PU, for example, output the first feedback signal at the feedback output terminal Ioff_out. For example, the feedback circuit 206 may couple the pull-up node PU to the feedback output terminal Ioff_out to output the level at the pull-up node as the first feedback signal.

FIG. 2B illustrates a circuit diagram of an example of the shift register circuit of FIG. 2A. As shown in FIG. 2B, the input circuit 201', the output circuit 202', the pull-down circuit 203', and the reset circuit 205' may have the same structures as those of the input circuit 101', the output circuit 102', the pull-down circuit 103', and the reset circuit 105' of FIG. 1B respectively, and will not be described in detail here. The feedback circuit 206' comprises a feedback sub-circuit, a first pull-down sub-circuit, and a second pull-down sub-circuit. In FIG. 2B, the feedback sub-circuit comprises a transistor T6 and a transistor T7. The feedback sub-circuit has a feedback output terminal Ioff_out configured to output a first feedback signal, and may generate the first feedback signal based on the level at the pull-up node PU and output the first feedback signal at the feedback output terminal Ioff_out. The first pull-down sub-circuit comprises a transistor T8, and the first pull-down sub-circuit may pull down the first feedback signal generated by the feedback sub-circuit under control of the level at the pull-down node PD. The second pull-down sub-circuit comprises a ninth transistor T9, and the second pull-down sub-circuit may pull down the level at the pull-up node PU under control of the level at the pull-down node PD. As shown in FIG. 2B, the transistor T6 has a gate coupled to the pull-up node PU, a first electrode coupled, for example, to a power supply signal terminal VDD to receive a power supply signal, and a second electrode coupled to a gate of the transistor T7. The transistor T7 has the gate coupled to a first electrode thereof, and a second electrode coupled to the feedback output terminal Ioff_out to output the first feedback signal. The transistor T8 has a gate coupled to the pull-down node PD, a first electrode coupled to the second electrode of the transistor T6, and a second electrode coupled to a first reference signal terminal VSS1. The transistor T9 has a gate coupled to the pull-down node PD, a first electrode coupled to the pull-up node PU, and a second electrode coupled to the first reference signal terminal VSS1.

FIG. 2C illustrates a circuit diagram of another example of the shift register circuit of FIG. 2A. FIG. 2C is similar to FIG. 2B except at least that a feedback output terminal Ioff_out of a feedback circuit 206" of FIG. 2C is also coupled back to the interior of the shift register circuit to stabilize the level at the pull-up node PU. For the sake of brevity, only the differences will be described in detail below.

As shown in FIG. 2C, an output circuit 202" and a pull-down circuit 203" may have the same structures as those of the output circuit 102' and the pull-down circuit 103' of FIG. 1B respectively, and will not be described in detail here.

The feedback circuit 206" of FIG. 2C comprises a third pull-down sub-circuit in addition to the feedback sub-circuit, the first pull-down sub-circuit and the second pull-down sub-circuit described above. The third pull-down sub-circuit is coupled between the second pull-down sub-circuit and the first reference signal terminal VSS1, the feedback output terminal Ioff_out is coupled to a node P between the second pull-down sub-circuit and the third pull-down sub-circuit, and the third pull-down sub-circuit may pull down the level at the "node P" under control of the level at the pull-down node PD. In FIG. 2C, the third pull-down sub-circuit comprises a transistor T10 having a gate coupled to the pull-down node PD, a first electrode coupled to the second electrode of the transistor T9, and a second electrode coupled to the first reference signal terminal VSS1. The feedback output terminal Ioff_out is coupled to the node P between the transistors T9 and T10, so that the first feedback signal generated by the feedback circuit based on the level at the pull-up node PU is provided to the node P to prevent electric leakage at the pull-up node PU, so as to stabilize the level at the pull-up node PU.

In some embodiments, the feedback output terminal Ioff_out may also be coupled to an input circuit 201" and/or a reset circuit 205" to further stabilize the level at the pull-up node PU.

As shown in FIG. 2C, the input circuit 201" comprises transistors T14 and T15 coupled in series between the signal input terminal INPUT and the pull-up node PU, and the feedback output terminal Ioff_out is coupled to a node between the transistors T14 and T15. Specifically, the transistor T14 has a gate and a first electrode coupled to the signal input terminal INPUT to receive the input signal, and a second electrode coupled to a first electrode of the transistor T15. The transistor T15 has a gate coupled to the gate of the transistor T14, the first electrode coupled to the second electrode of the transistor T14, and a second electrode coupled to the pull-up node PU. The feedback output terminal Ioff_out is coupled to the second electrode of the transistor T14 and the first electrode of the transistor T15.

As shown in FIG. 2C, the reset circuit 205" comprises a transistor T16 and a transistor T17 coupled in series between the pull-up node PU and the first reference signal terminal VSS1, and the feedback output terminal Ioff_out is coupled to a node between the transistors T16 and T17. The transistor T16 has a gate coupled, for example, to a reset signal terminal Rst1 to receive a first reset signal, a first electrode coupled to the pull-up node PU, and a second electrode coupled to a first electrode of the transistor T17. The transistor T17 has a gate coupled, for example, to the reset signal terminal Rst1 to receive the first reset signal, the first electrode coupled to the second electrode of the transistor T16, and a second electrode coupled to the first reference signal terminal VSS1. The feedback output terminal Ioff_out is coupled to the second electrode of the transistor T16 and the first electrode of the transistor T17. In FIG. 2C, the reset circuit 205" further comprises transistors T22 and T24 coupled in series between the pull-up node PU and the first reference signal terminal VSS1, and the feedback output terminal Ioff_out is also coupled to a node between transistors T22 and T24. Specifically, the transistor T22 has a gate, for example, coupled to a reset signal terminal Rst2 to receive a second reset signal, a first electrode coupled to the pull-up node PU, and a second electrode coupled to a first electrode of the transistor T24. The transistor T24 has a gate, for example, coupled to the reset signal terminal Rst2 to receive the second reset signal, the first electrode coupled to the second electrode of the transistor T22, and a second electrode coupled to the first reference signal terminal VSS1. The feedback output terminal Ioff_out is coupled to the second electrode of the transistor T22 and the first electrode of the transistor T24.

Figure 3A:
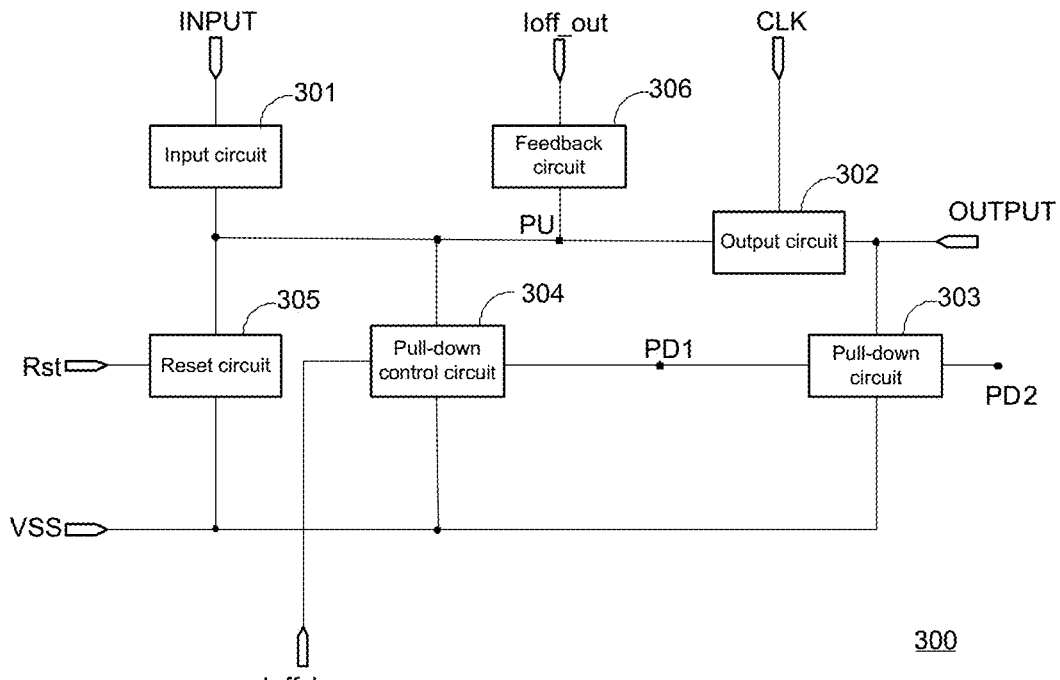
FIG. 3A illustrates a schematic block diagram of a shift register circuit according to yet another embodiment of the present disclosure.
Figure 3B:
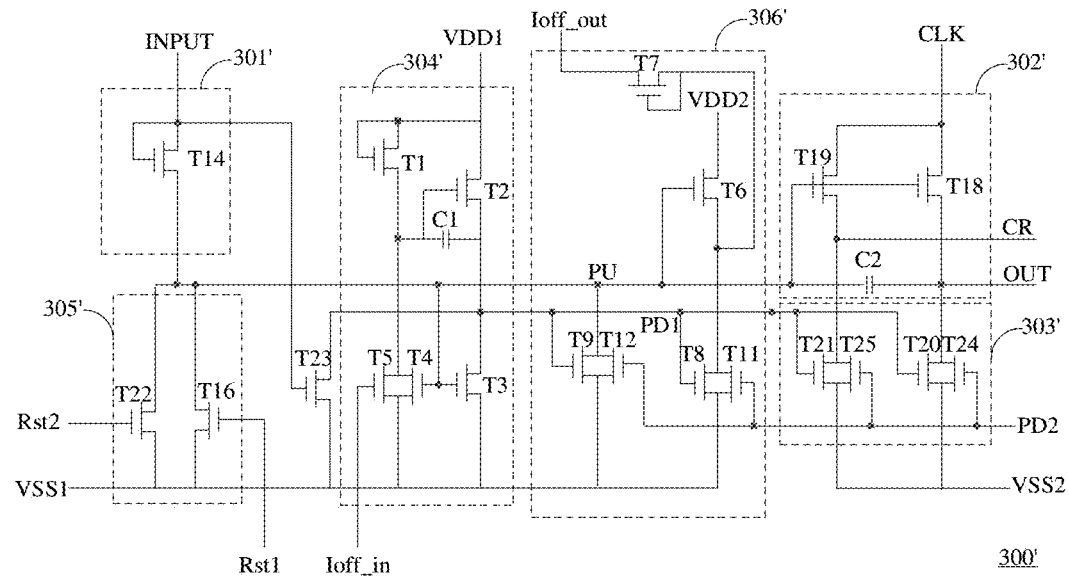
FIG. 3B illustrates a circuit diagram of an example of the shift register circuit of FIG. 3A.
Figure 3C:
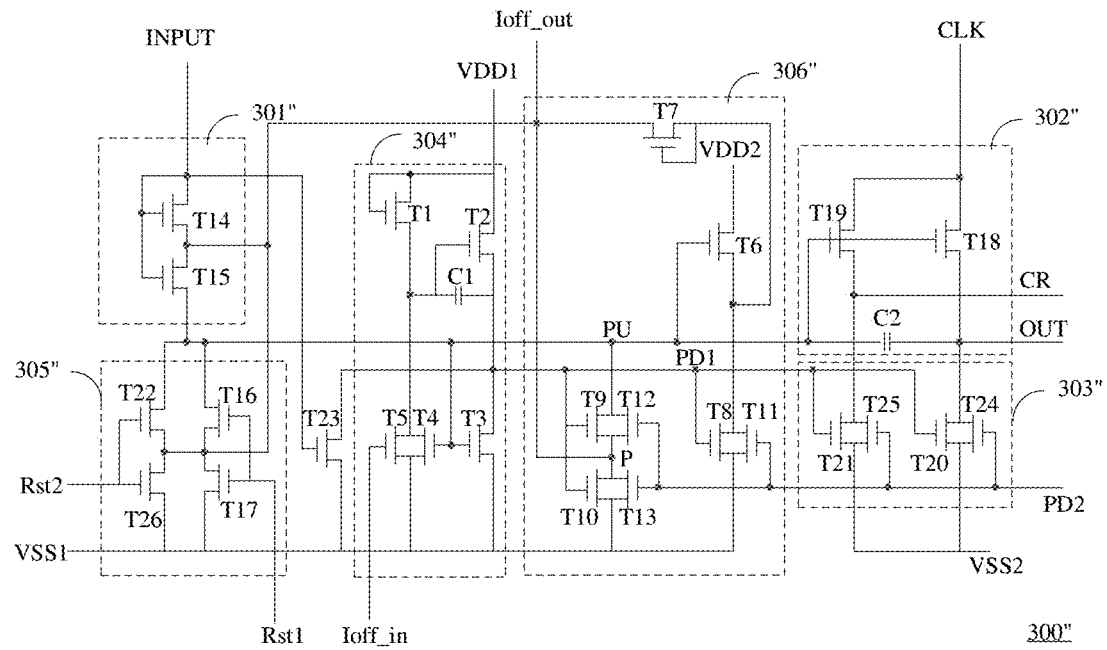
FIG. 3C illustrates a circuit diagram of another example of the shift register circuit of FIG. 3A.

A shift register circuit according to another embodiment of the present disclosure will be described below with reference to FIGS. 3A, 3B, and 3C. The shift register circuits of FIGS. 3A, 3B, and 3C are similar to those of FIGS. 1A, 1B, 2A, 2B, and 2C, except at least that the shift register circuits of FIGS. 3A, 3B, and 3C comprise not only a feedback circuit but also a pull-down control circuit, and the shift register circuits of FIGS. 3A, 3B, and 3C have two pull-down nodes PD1 and PD2. For the sake of brevity, only the differences will be primarily described in detail below.

FIG. 3A illustrates a schematic block diagram of a shift register circuit according to yet another embodiment of the present disclosure. As shown in FIG. 3A, the shift register circuit 300 comprises an input circuit 301, an output circuit 302, a pull-down circuit 303, a pull-down control circuit 304, and a feedback circuit 306. The shift register circuit 300 may further comprise a reset circuit 305. The input circuit 301, the output circuit 302, and the reset circuit 305 may have the same structures as those of the input circuits, the output circuits, and the reset circuits described above with reference to FIGS. 1A, 1B, and 2A, 2B, and 2C, and will not be described in detail here.

The pull-down circuit 303 is coupled to a signal output terminal OUTPUT, a first pull-down node PD1 and a second pull-down node PD2, and the pull-down circuit 303 may pull down a level at the signal output terminal OUTPUT under control of levels at the first pull-down node PD1 and the second pull-down node PD2.

The feedback circuit 306 is coupled to the pull-up node PU, and may output a first feedback signal based on a level at the pull-up node PU, for example, output the first feedback signal at a feedback output terminal Ioff_out.

The pull-down control circuit 304 is coupled to the pull-up node PU and the first pull-down node PD1, and the pull-down control circuit 304 may receive a second feedback signal, for example, from a feedback input terminal Ioff_in and control the level at the first pull-down node PD1 under control of the level at the pull-up node PU and the second feedback signal.

FIG. 3B illustrates a circuit diagram of an example of the shift register circuit of FIG. 3A. As shown in FIG. 3B, the shift register circuit 300' comprises an input circuit 301', an output circuit 302', a pull-down circuit 303', a pull-down control circuit 304', a reset circuit 305', and a feedback circuit 306'. The input circuit 301', the output circuit 302', and the reset circuit 305' may have the same structures as those of the input circuit 101', the output circuit 102', and the reset circuit 105' of FIG. 1B respectively, and will not be described in detail here.

The pull-down circuit 303' comprises a first pull-down circuit and a second pull-down circuit, wherein the first pull-down circuit is configured to pull down levels at signal output terminals CR and OUT according to the level at the first pull-down node PD1, and the second pull-down circuit is configured to pull down the levels at the signal output terminals CR and OUT according to the level at the second pull-down node PD2. In FIG. 3B, the first pull-down circuit may comprise transistors T20 and T21, and the second pull-down circuit may comprise transistors T24 and T25. The transistor T20 has a gate coupled to the first pull-down node PD1, a first electrode coupled to the first signal output terminal OUT, and a second electrode coupled to a second reference signal terminal VSS2. The transistor T21 has a gate coupled to the first pull-down node PD1, a first electrode coupled to the second signal output terminal CR, and a second electrode coupled to the second reference signal terminal VSS2. The transistor T24 has a gate coupled to the second pull-down node PD2, a first electrode coupled to the first signal output terminal OUT, and a second electrode coupled to the second reference signal terminal VSS2. The transistor T25 has a gate coupled to the second pull-down node PD2, a first electrode coupled to the second signal output terminal CR, and a second electrode coupled to the second reference signal terminal VSS2.

The pull-down control circuit 304' may have the same structure as that of the pull-down control circuit 104' of FIG. 1B, and in the pull-down control circuit 304', a second electrode of a transistor T2 and a first electrode of a transistor T3 are coupled to the first pull-down node PD1.

The feedback circuit 306' may have a similar structure to that of the feedback circuit 206' of FIG. 2B, primarily except that the first pull-down sub-circuit of the feedback circuit 306' comprises a transistor T11 in addition to a transistor T8, and the second pull-down sub-circuit comprises a transistor T12 in addition to a transistor T9. As shown in FIG. 3B, the transistor T8 has a gate coupled to the first pull-down node PD1, a first electrode coupled to a second electrode of a transistor T6, and a second electrode coupled to a first reference signal terminal VSS1; and the transistor T11 has a gate coupled to the second pull-down node PD2, a first electrode coupled to the second electrode of the transistor T6, and a second electrode coupled to the first reference signal terminal VSS1. The transistor T9 has a gate coupled to the first pull-down node PD1, a first electrode coupled to the pull-up node PU, and a second electrode coupled to the first reference signal terminal VSS1, and the transistor T12 has a gate coupled to the second pull-down node PD2, a first electrode coupled to the pull-up node PU, and a second electrode coupled to the first reference signal terminal VSS1.

In FIG. 3B, the shift register circuit 300' has two power supply signal terminals VDD1 and VDD2, wherein the power supply signal terminal VDD1 is used to provide a power supply signal to the pull-down control circuit 304', and the power supply signal terminal VDD2 is used to provide a power supply signal to the feedback circuit 306'. However, it should be apparent to those skilled in the art that the embodiments of the present disclosure are not limited thereto, and the power supply signal terminals VDD1 and VDD2 may also be implemented as one power supply signal terminal.

FIG. 3C illustrates a circuit diagram of another example of the shift register circuit of FIG. 3A. The shift register circuit 300" of FIG. 3C is similar to the shift register circuit 300' of FIG. 3B, except at least that a feedback output terminal Ioff_out of a feedback circuit 306" of FIG. 3C is also coupled back to the interior of the shift register circuit 300" to stabilize a level at a pull-up node PU. For the sake of brevity, only the differences will be primarily described in detail below.

As shown in FIG. 3C, the shift register circuit 300" comprises an input circuit 301", an output circuit 302", a pull-down circuit 303", a pull-down control circuit 304", a reset circuit 305", and a feedback circuit 306", wherein the output circuit 302", the pull-down circuit 303" and the pull-down control circuit 304" may have the same structures as those of the output circuit 302', the pull-down circuit 303', and the pull-down control circuit 304' of FIG. 3B respectively, and will not be described in detail here.

The feedback circuit 306" shown in FIG. 3C comprises a third control sub-circuit in addition to the feedback sub-circuit (comprising the transistors T6 and T7), the first control sub-circuit (comprising the transistors T8 and T11), and the second control sub-circuit (comprising the transistors T9 and T12) as shown in FIG. 3B. In FIG. 3C, the third control sub-circuit comprises transistors T10 and T13. Similarly to FIG. 2C, the third control sub-circuit of FIG. 3C is coupled between the second control sub-circuit and a first reference signal terminal VSS1, a feedback output terminal Ioff_out is also coupled to a node P between the second control sub-circuit and the third control sub-circuit, and the third control sub-circuit may pull down a level at the "node P" under control of levels at a first pull-down node PD1 and a second pull-down node PD2. As shown in FIG. 3C, the transistor T10 has a gate coupled to the first pull-down node PD1, a first electrode coupled to the second electrode of the transistor T9 to receive a first feedback signal, and a second electrode coupled to the first reference signal terminal VSS1; and the transistor T13 has a gate coupled to the second pull-down node PD2, a first electrode coupled to the second electrode of the transistor T12 to receive the first feedback signal, and a second electrode coupled to the first reference signal terminal VSS1.

An operational timing of the shift register circuit of FIG. 3C will be described below with reference to FIG. 8A.

Figure 8A:
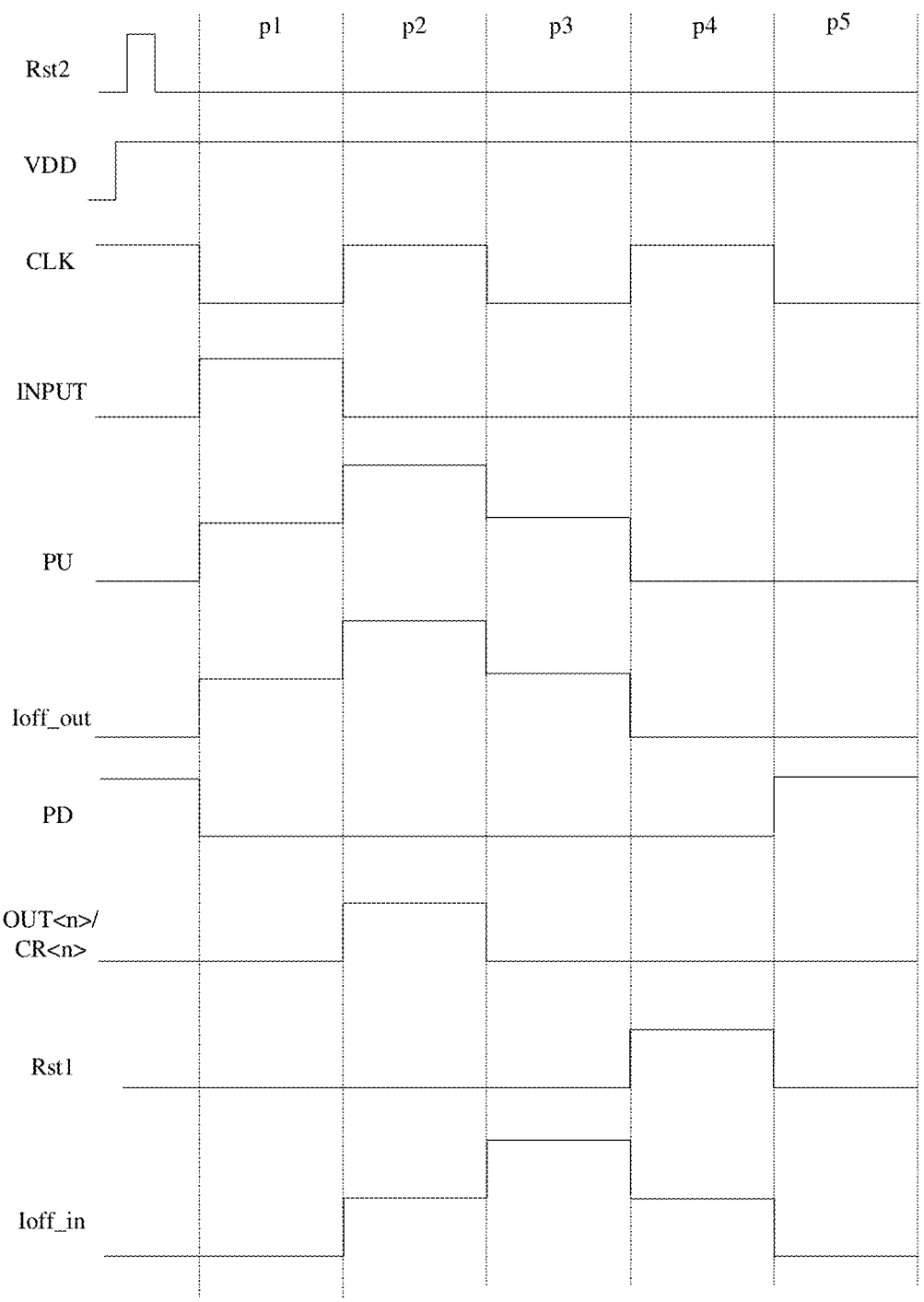
FIG. 8A illustrates an operational timing diagram of a shift register circuit according to an embodiment of the present disclosure.

FIG. 8A illustrates the operational timing of the shift register circuit 300". As shown in FIG. 8A, in an initial phase, the shift register circuit is reset by the second reset signal at the second reset signal terminal Rst2, the power supply signal VDD becomes a high level, and the transistors T1 and T2 are turned on, so that the pull-down node PD is at a high level.

In a time period p1, the clock signal at the clock signal terminal CLK is at a low level, and the input signal received at the signal input terminal INPUT is at a high level. Since the input signal is at a high level, the transistors T14 and T15 are turned on, the pull-up node PU becomes a high level, and the capacitor C2 starts to be charged. Also, since the input signal is at a high level, the transistor T23 is turned on, so that the first pull-down node PD is pulled down to a low level. Since the pull-up node PU is at a high level, the transistors T18 and T19 are turned on, so as to introduce the clock signal at the clock signal terminal CLK to the first signal output terminal OUT and the second signal output terminal CR. At this time, since the clock signal at the clock signal terminal CLK is at a low level, the first signal output terminal OUT and the second signal output terminal CR are both at a low level. Also, since the pull-up node PU is at a high level, the transistor T6 is turned on, and thereby the transistor T7 is turned on, so that the first feedback signal at the feedback output terminal Ioff_out is at a high level. Also, since the pull-up node PU is at a high level, the transistors T3 and T4 are turned on, so that the pull-down node PD is pulled down to a low level.

In a time period p2, the clock signal at the clock signal terminal CLK becomes a high level, and the second feedback signal received at the feedback input terminal Ioff_in becomes a high level. Since the transistors T18 and T19 are in a turn-on state at this time, the first signal output terminal OUT and the second signal output terminal CR also become a high level due to the high level at the clock signal terminal CLK. Since the level at the pull-up node PU further rises due to the bootstrap of the capacitor C2, the level at the feedback output terminal Ioff_out also rises accordingly. In this time period, since the pull-up node PU continues to be at a high level, the transistors T3 and T4 are turned on, and since the feedback input terminal Ioff_in is also at a high level, the transistor T5 in the pull-down control circuit 304" is also turned on, so that the pull-down node PD continues to be maintained at a low level.

In a time period p3, the clock signal at the clock signal terminal CLK becomes a low level, and the level at the feedback input terminal Ioff_in further rises. Since the clock signal terminal CLK is at a low level, both the first signal output terminal OUT and the second signal output terminal CR also become a low level. At this time, the capacitor C2 is discharged, so that the level at the pull-up node PU decreases to some extent, and the level at the feedback output terminal Ioff_out also decreases accordingly. In this time period, also since the pull-up node PU and the feedback input terminal Ioff_in continue to be at a high level, the transistors T3, T4, and T5 in the pull-down control circuit 304" continue to be turned on, so that the pull-down node PD continues to be maintained at a low level.

In a time period p4, the clock signal at the clock signal terminal CLK becomes a high level, the first reset signal at the first reset signal terminal Rst1 becomes a high level, and the level at the feedback input terminal Ioff_in decreases. Since the first reset signal terminal Rst1 is at a high level, the transistors T16 and T17 in the reset circuit 305" are turned on to pull down the pull-up node PU to a low level, so that the transistors T18 and T19 are turned off, and the first signal output terminal OUT and the second signal output terminal CR continue to be maintained at a low level. In this time period, since the pull-up node PU is at a low level, the transistors T3 and T4 in the pull-down control circuit 304" are turned off, but since the feedback input terminal Ioff_in is still at a high level, the transistor T5 is still in a turn-on state, so that the pull-down node PD is still at a low level.

In a time period p5, the first feedback signal at the feedback input terminal Ioff_in becomes a low level, and the first reset signal Rst1 becomes a low level. At this time, since the pull-up node PU and the feedback input terminal Ioff_in are both at a low level, the transistors T3, T4 and T5 in the pull-down control circuit 304" are all turned off, and since the power supply signal terminal VDD is at a high level, the transistors T1 and T2 are turned on to pull up the pull-down node PD to a high level, so that a second pull-down node PD2<n+1> is also pulled up to a high level, to continuously pull down signal output terminals of shift register circuits SR<n> and SR<n+1>.

The operational timing has been described above by taking the shift register circuit having both a pull-down control circuit and a feedback circuit described above as an example. A shift register circuit having one of a pull-down control circuit or a feedback circuit has a similar operational timing, which will not be described in detail here.

Embodiments of the present disclosure further provide a gate driving circuit, which may comprise the shift register circuits described above.

A gate driving circuit according to an embodiment of the present disclosure will be described in detail below with reference to FIGS. 4A and 4B.

Figure 4A:
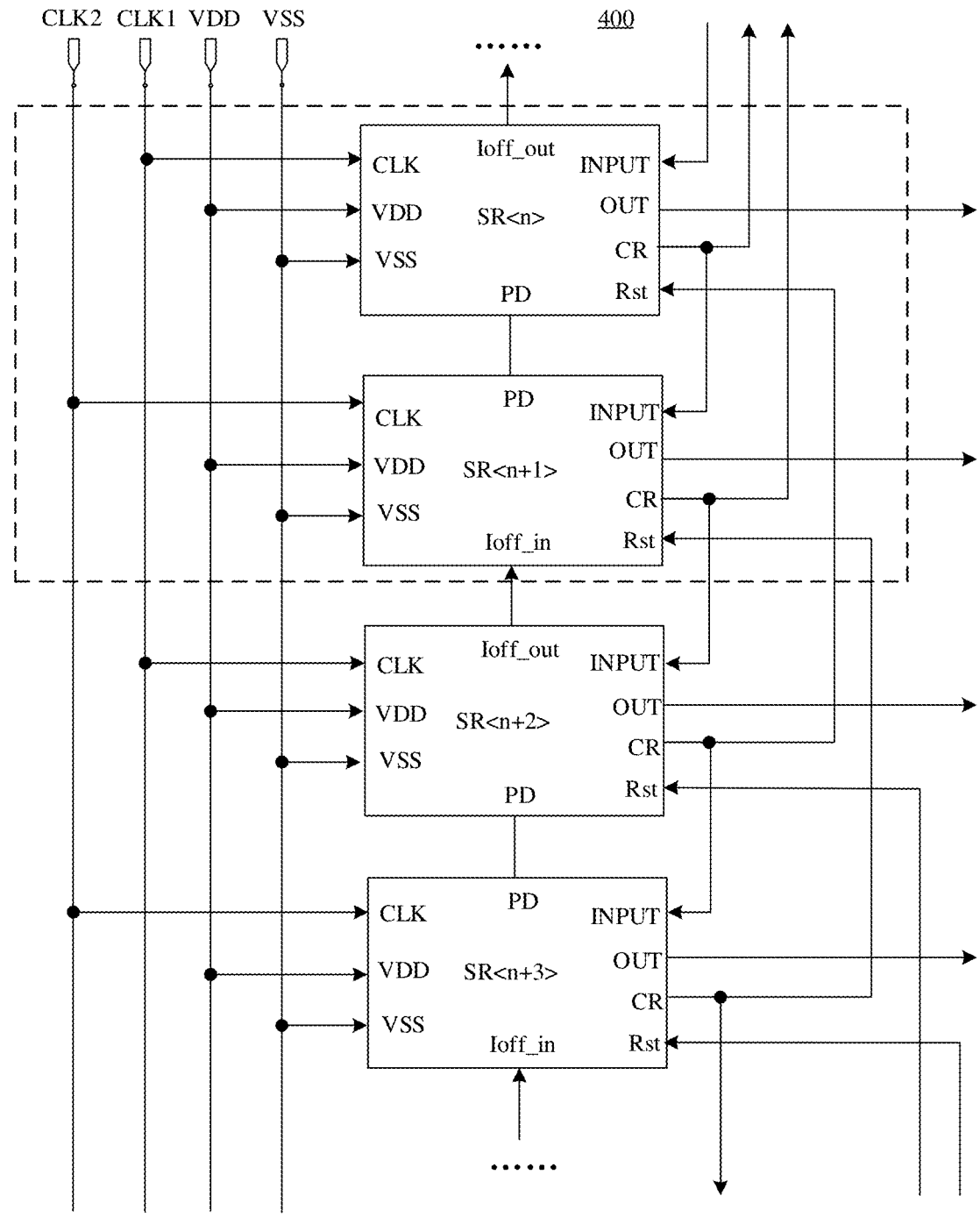
FIG. 4A illustrates a schematic block diagram of a gate driving circuit according to an embodiment of the present disclosure.

FIG. 4A illustrates a schematic block diagram of a gate driving circuit according to an embodiment of the present disclosure. As shown in FIG. 4A, the gate driving circuit 400 comprises cascaded shift register circuits SR at N stages, where N is an integer greater than or equal to 4. The shift register circuits SR may be implemented by the shift register circuits described above with reference to FIGS. 1A, 1B, 2A, 2B, and 2C, so that for each shift register circuit having a pull-down control circuit, the shift register circuit at its next stage has a feedback circuit. For example, the shift register circuits SR at odd-numbered stages may be implemented by the shift register circuit 100 or 100' described above, and the shift register circuits at even-numbered stages may be implemented by the shift register circuit 200, 200' or 200" described above, or vice versa. In FIG. 4A, the shift register circuits SR<n>, SR<n+2>, SR<n+4> . . . are the shift register circuit 200, 200' or 200" described above with reference to FIG. 2A, FIG. 2B or FIG. 2C, and the shift register circuits SR<n+1>, SR<n+3>, SR<n+5> . . . are the shift register circuit 100 or 100' described above with reference to FIG. 1A or FIG. 1B, where n is an integer and 2≤n<N−2.

As shown in FIG. 4A, in each shift register circuit, a power supply signal terminal VDD receives a power supply signal, and a reference signal terminal VSS receives a reference signal (for example, a first reference signal terminal VSS1 may receive a first reference signal VGL, and a second reference signal terminal VSS2 may receive a second reference signal LVGL). Clock signal terminals of the shift register circuits SR<n>, SR<n+2>, SR<n+4> . . . receive a first clock signal CLK1, and clock signal terminals of the shift register circuits SR<n+1>, SR<n+3>, SR<n+5> . . . receive a second clock signal CLK2.

As shown in FIG. 4A, a signal input terminal INPUT of the shift register circuit at the $n^{th}$ stage SR<n> is coupled to a signal output terminal (for example, a second signal output terminal CR) of the shift register circuit at the $(n-1)^{th}$ stage SR<n-1>, to receive an output signal from the shift register circuit SR<n-1> as an input signal. A reset signal terminal Rst (for example, a first reset signal terminal Rst1) of the shift register circuit at the $n^{th}$ stage SR<n> is coupled to a signal output terminal (for example, a second signal output terminal CR) of the shift register circuit at the $(n+2)^{th}$ stage SR<n+2> to receive an output signal from the shift register circuit SR<n+2> as a reset signal.

As shown in FIG. 4A, each shift register circuit having a pull-down control circuit receives a first feedback signal output from a feedback circuit of the shift register circuit at its next stage as a second feedback signal. For example, a feedback input terminal Ioff_in of SR<n+1> is coupled to a feedback output terminal Ioff_out of the shift register circuit at its next stage SR<n+2>, and a feedback input terminal Ioff_in of the shift register circuit SR<n+3> is coupled to a feedback output terminal Ioff_out of the shift register circuit at the next stage SR<n+4>, and so on.

In FIG. 4A, a pull-down node PD of a shift register circuit having a pull-down control circuit is coupled to a pull-down node PD of shift register circuit at its previous stage to form a group of shift register circuits, for example, pull-down nodes PD of the shift register circuits SR<n+1> and SR<n> are coupled with each other to form a group of shift register circuits (as indicated by a dashed box), pull-down nodes PD of the shift register circuits SR<n+3> and SR<n+2> are coupled with each other to form a group of shift register circuits, and so on. In FIG. 4A, clock signal terminals CLK of two shift register circuits in a group receive the first clock signal CLK1 and the second clock signal CLK2 respectively.

Figure 4B:
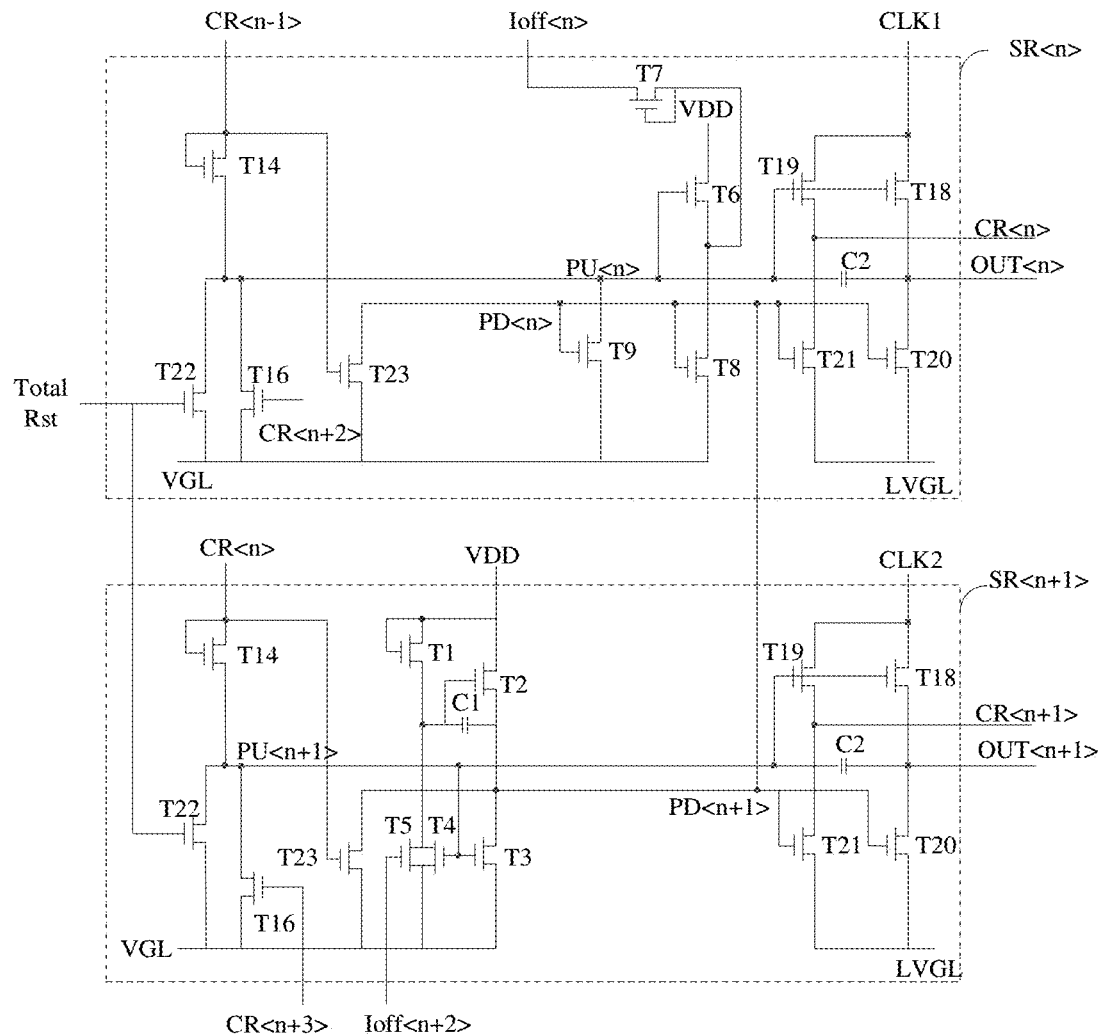
FIG. 4B illustrates a circuit diagram of an example of a group of shift register circuits in the gate driving circuit of FIG. 4A.

FIG. 4B illustrates a circuit connection diagram of the group of shift register circuits shown by the dashed box in FIG. 4A. As shown in FIG. 4B, the shift register circuit at the $n^{th}$ stage SR<n> has the structure shown in FIG. 2B, and the shift register circuit at the $(n+1)^{th}$ stage SR<n+1> has the structure shown in FIG. 1B. The pull-down node PD<n> of the shift register circuit SR<n> is coupled to the pull-down node PD<n+1> of the shift register circuit SR<n+1>.

The shift register circuit at the $n^{th}$ stage SR<n> receives a second output signal CR<n-1> from the shift register circuit at the $(n-1)^{th}$ stage SR<n-1> as an input signal at the signal input terminal, receives a second output signal CR<n+2> from the shift register circuit at the $(n+2)^{th}$ stage SR<n+2> as a first reset signal at the first reset signal terminal, receives a second reset signal Total Rst at a second reset signal terminal, receive the first clock signal CLK1 at a clock signal terminal, outputs a first feedback signal Ioff<n> at a feedback output terminal to be provided to SR<n-1>, provides a first output signal OUT<n> at a first signal output terminal, and provides a second output signal CR<n> at the second signal output terminal.

The shift register circuit at the $(n+1)^{th}$ stage SR<n+1> receives the second output signal CR<n> from the shift register circuit at the $n^{th}$ stage SR<n> as an input signal at a signal input terminal, receives a second output signal CR<n+3> from the shift register circuit at the $(n+3)^{th}$ stage SR<n+3> as a first reset signal at a first reset signal terminal, receives a second reset signal Total Rst at a second reset signal terminal, receives the second clock signal CLK2 at the clock signal terminal, receives a first feedback signal Ioff<n+2> generated by the shift register circuit at the next stage SR<n+2> at a feedback input terminal, provides a first output signal OUT<n+1> at a first signal output terminal, and provides a second output signal CR<n+1> at a second signal output terminal.

A gate driving circuit according to another embodiment of the present disclosure will be described in detail below with reference to FIGS. 5A and 5B.

Figure 5A:
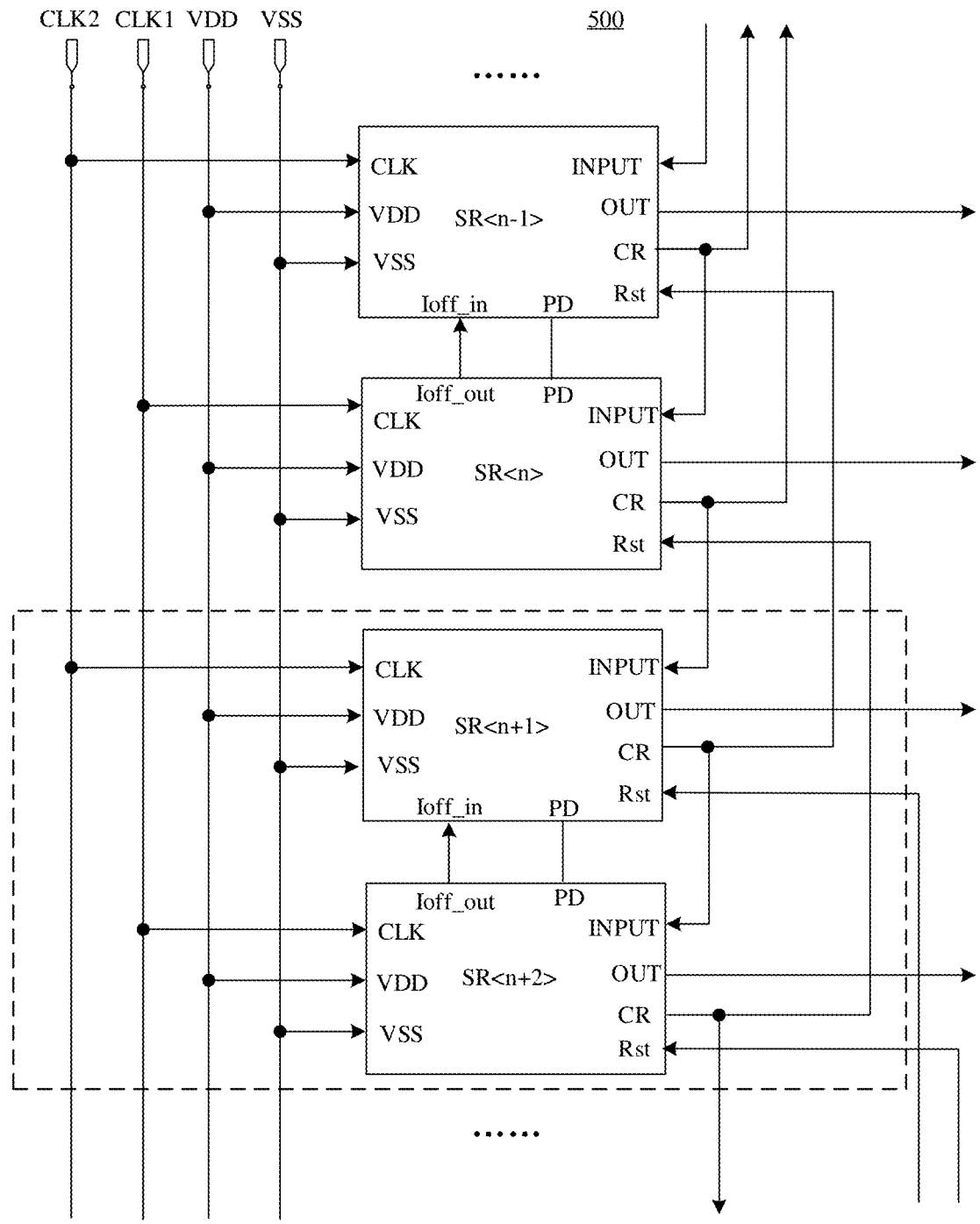
FIG. 5A illustrates a schematic block diagram of a gate driving circuit according to another embodiment of the present disclosure.
Figure 5B:
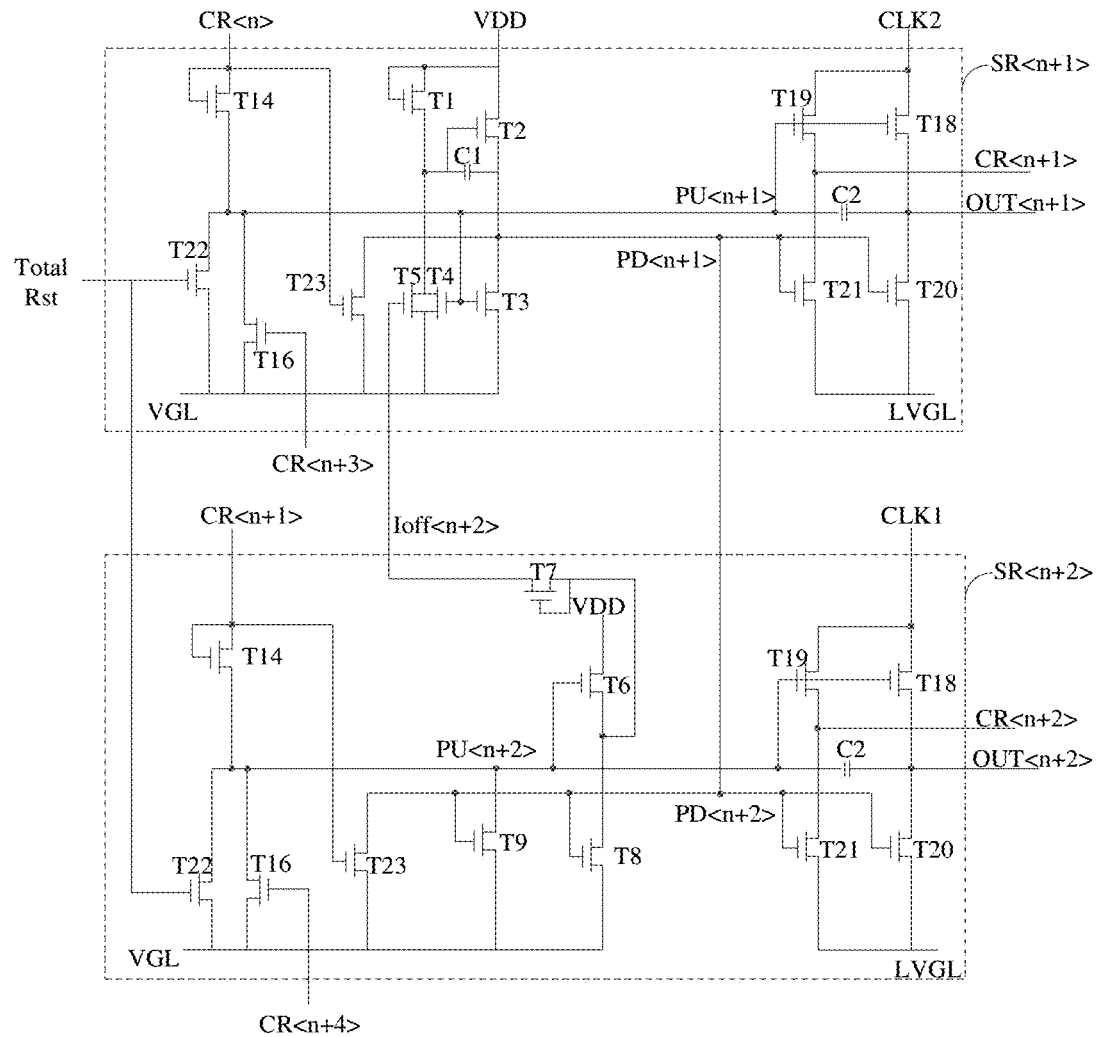
FIG. 5B illustrates a circuit diagram of an example of a group of shift register circuits in the gate driving circuit of FIG. 5A.

The gate driving circuit 500 of FIGS. 5A and 5B is similar to the gate driving circuit 400 of FIGS. 4A and 4B except at least that a pull-down node of each shift register circuit having a pull-down control circuit of FIGS. 5A and 5B is coupled to a pull-down node of the shift register circuit at its next stage (instead of its previous stage). For the sake of brevity, the differences will be primarily described in detail below.

FIG. 5A illustrates a schematic block diagram of a gate driving circuit according to another embodiment of the present disclosure. As shown in FIG. 5A, pull-down nodes PD of shift register circuits SR<n-1> and SR<n> are coupled with each other to form a group of shift register circuits, and pull-down nodes PD of shift register circuits SR<n+1> and SR<n+2> are coupled with each other to form a group of shift register circuits (as indicated by a dashed box), and so on.

FIG. 5B illustrates a circuit connection diagram of the group of shift register circuits shown by the dashed box in FIG. 5A. As shown in FIG. 5B, the shift register circuit at the $(n+1)^{th}$ stage SR<n+1> has the structure shown in FIG. 1B, the shift register circuit at the $(n+2)^{th}$ stage SR<n+2> has the structure shown in FIG. 2B, and a pull-down node PD<n+1> of the shift register circuit SR<n+1> is coupled to a pull-down node PD<n+2> of the shift register circuit SR<n+2>.

The shift register circuit at the $(n+1)^{th}$ stage SR<n+1> receives a second output signal CR<n> from the shift register circuit at the $n^{th}$ stage SR<n> as an input signal at a signal input terminal, receives a second output signal CR<n+3> from the shift register circuit at the $(n+3)^{th}$ stage SR<n+3> as a first reset signal at a first reset signal terminal, receives a second reset signal Total Rst at a second reset signal terminal, receives a second clock signal CLK2 at a clock signal terminal, receives a first feedback signal Ioff<n+2> from the shift register circuit SR<n+2> at a feedback input terminal, provides a first output signal OUT<n+1> at a first signal output terminal, and provides a second output signal CR<n+1> at a second signal output terminal.

The shift register circuit at the $(n+2)^{th}$ stage SR<n+2> receives the second output signal CR<n+1> from the shift register circuit at the $(n+1)^{th}$ stage SR<n+1> as an input signal at a signal input terminal, receives a second output signal CR<n+4> from the shift register circuit at the $(n+4)^{th}$ stage SR<n+4> as a first reset signal at a first reset signal terminal, receives a second reset signal Total Rst at a second reset signal terminal, receives a first clock signal CLK1 at a clock signal terminal, outputs a first feedback signal Ioff<n+2> at a feedback output terminal, provides a first output signal OUT<n+2> at a first signal output terminal, and provides a second output signal CR<n+2> at a second signal output terminal.

Figure 6A:
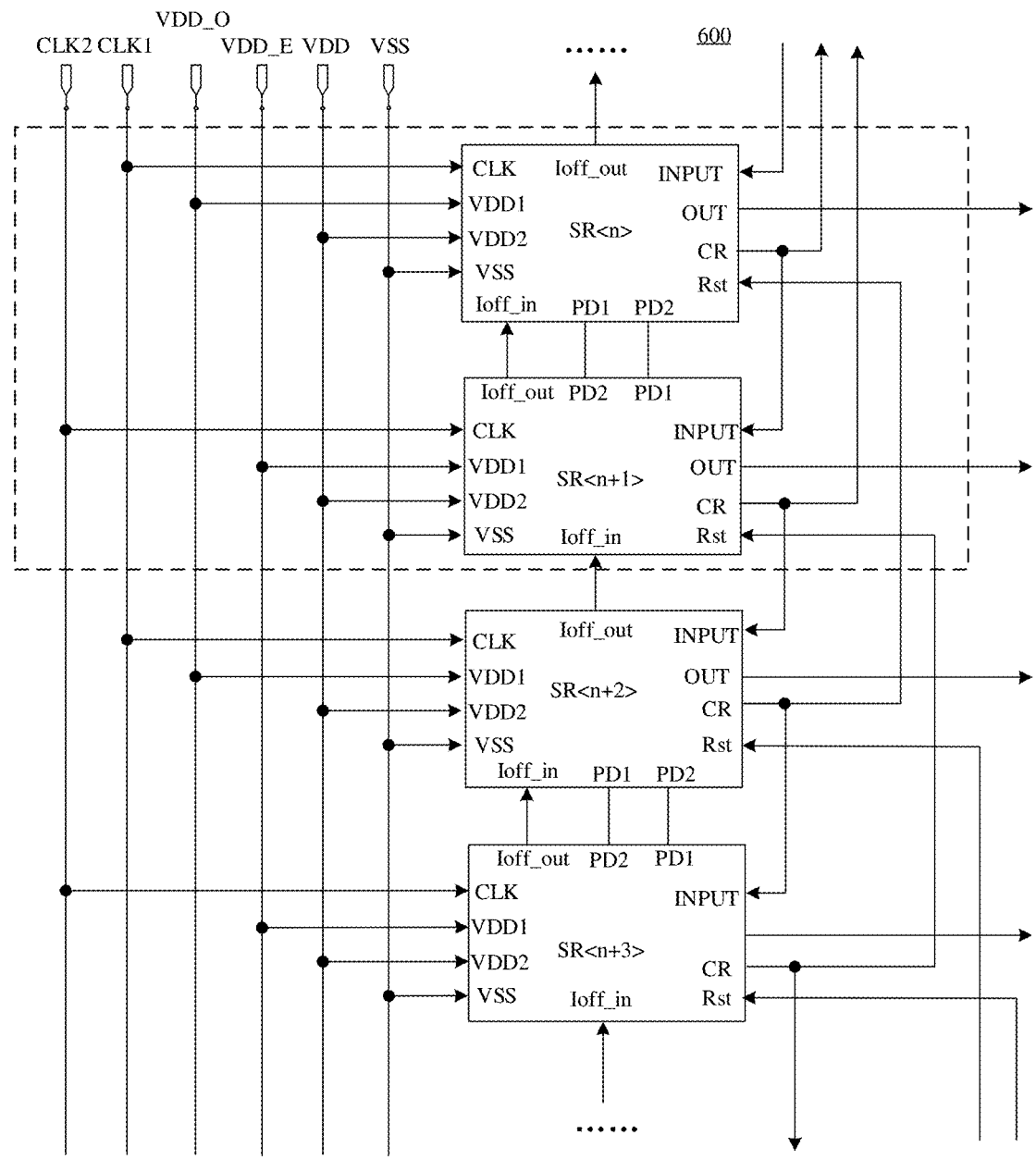
FIG. 6A illustrates a schematic block diagram of a gate driving circuit according to yet another embodiment of the present disclosure.
Figure 6B:
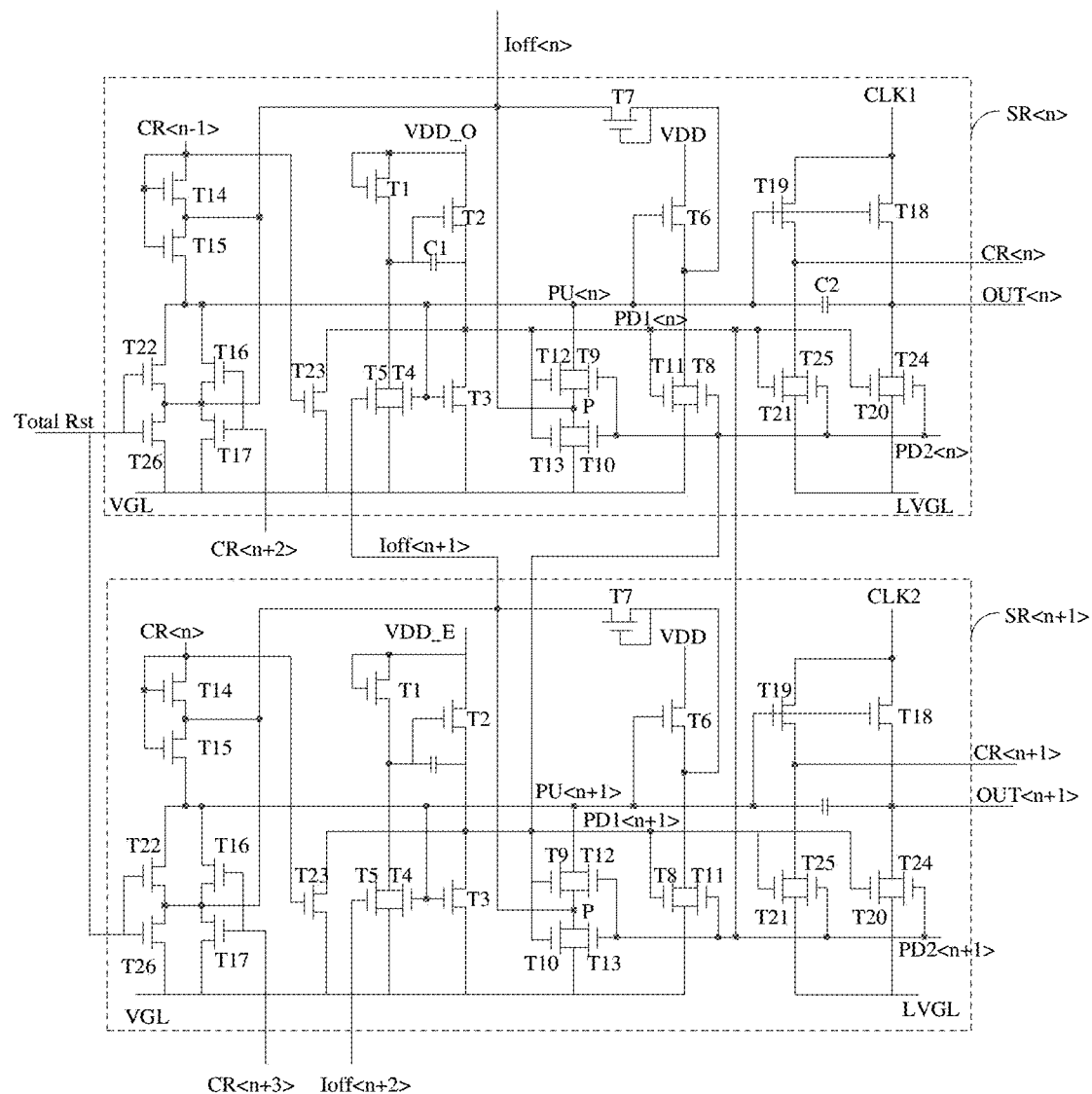
FIG. 6B illustrates a circuit diagram of an example of a group of shift register circuits in the gate driving circuit of FIG. 6A.

A gate driving circuit according to still another embodiment of the present disclosure will be described in detail below with reference to FIGS. 6A and 6B. The gate driving circuit 600 of FIGS. 6A and 6B is similar to the gate driving circuit 400 of FIGS. 4A and 4B and the gate driving circuit 500 of FIGS. 5A and 5B, except at least that each of the shift register circuits in FIGS. 6A and 6B is implemented by the shift register circuit 300, 300' or 300" described above with reference to FIG. 3A, FIG. 3B or FIG. 3C. For the sake of brevity, the differences will be mainly described in detail below.

FIG. 6A illustrates a schematic block diagram of a gate driving circuit according to yet another embodiment of the present disclosure. As shown in FIG. 6A, the gate driving circuit 600 comprises cascaded shift register circuits at N stages SR, where N is an integer greater than or equal to 4. The shift register circuit SR may be implemented by the shift register circuit 300, 300' or 300" described above with reference to FIG. 3A, FIG. 3B or FIG. 3C.

A signal input terminal INPUT, a first signal output terminal OUT, a second signal output terminal CR, a reset signal terminal Rst, a clock signal terminal CLK, and a reference signal terminal VSS of each shift register circuit in FIG. 6A may be coupled in the same manner as that in FIGS. 4A, 4B, 5A and 5B, and will not be described in detail here. A second power supply signal terminal VDD2 (i.e., the power supply signal terminal configured to provide a power supply signal to a feedback circuit as described above) of each shift register circuit receives a power supply signal VDD.

As shown in FIG. 6A, each shift register circuit receives a first feedback signal output by the shift register circuit at its next stage as a second feedback signal, for example, a feedback input terminal Ioff_in of a shift register circuit SR<n> is coupled to a feedback output terminal Ioff_out of the shift register circuit at its next stage SR<n+1>, and a feedback input terminal Ioff_in of the shift register circuit SR<n+1> is coupled to a feedback output terminal Ioff_out of the shift register circuit at its next stage SR<n+2>, and so on.

In FIG. 6A, pull-down nodes of the shift register circuits SR<n> and SR<n+1> are coupled with each other to form a group of shift register circuits (as indicated by a dashed box), pull-down nodes of shift register circuits SR<n+2> and SR<n+3> are coupled with each other to form a group of shift register circuits, and so on, so that each shift register circuit is coupled to a pull-down node of the shift register circuit at its previous or next stage to form a group of shift register circuits.

In FIG. 6A, it is assumed that shift register circuits SR<n>, SR<n+2>, SR<n+4> . . . are the shift register circuits at odd-numbered stages, and shift register circuits SR<n+1>, SR<n+3>, SR<n+5> . . . are the shift register circuits at even-numbered stages, wherein first power supply signal terminals VDD1 (i.e., the power supply signal terminal configured to provide a power supply signal to a pull-down control circuit as described above) of the shift register circuits at the odd-numbered stages receive a first power supply signal VDD_O, and first power supply signal terminals VDD1 of the shift register circuits at the even-numbered stages receive a second power supply signal VDD_E. Of course, the above description is merely an example, and the above-mentioned "odd-numbered" and "even-numbered" are used interchangeably.

FIG. 6B illustrates a circuit connection diagram of an example of the group of shift register circuits shown by the dashed box in FIG. 6A.

In FIG. 6B, the two shift register circuits SR<n> and SR<n+1> in the group each have the structure shown in FIG. 3C, and a first pull-down node PD1<n> and a second pull-down node PD2<n> of the shift register circuit SR<n> are coupled to a second pull-down node PD2<n+1> and a first pull-down node PD1<n+1> of the shift register circuit SR<n+1> respectively.

The shift register circuit at the $n^{th}$ stage SR<n> receives a second output signal CR<n−1> from the shift register circuit at the $(n−1)^{th}$ stage SR<n−1> as an input signal at the signal input terminal, receives a second output signal CR<n+2> from the shift register circuit at the $(n+2)^{th}$ stage SR<n+2> as a first reset signal at the first reset signal terminal, receives a second reset signal Total Rst at a second reset signal terminal, receives a first clock signal CLK1 at the clock signal terminal, outputs a feedback signal Ioff<n> at a feedback output terminal to be provided to a pull-down control circuit of SR<n−1>, receives a feedback signal Ioff<n+1> from the shift register circuit SR<n+1> at the feedback input terminal, provides a first output signal OUT<n> at the first signal output terminal, and provides a second output signal CR<n> at the second signal output terminal.

The shift register circuit at the $(n+1)^{th}$ stage SR<n+1> receives the second output signal CR<n> from the shift register circuit at the $n^{th}$ stage SR<n> as an input signal at the signal input terminal, receives a second output signal CR<n+3> from the shift register circuit at the $(n+3)^{th}$ stage SR<n+3> as a first reset signal at the first reset signal terminal, receives a second reset signal Total Rst at a second reset signal terminal, receives a second clock signal CLK2 at the clock signal terminal, outputs a feedback signal Ioff<n+1> at a feedback output terminal to be provided to the shift register circuit SR<n>, receives a feedback signal Ioff<n+2> from the shift register circuit SR<n+2> at the feedback input terminal, provides a first output signal OUT<n+1> at the first signal output terminal, and provides a second output signal CR<n+1> at the second signal output terminal.

The first power supply signal terminal of the shift register circuit SR<n>, i.e., the power supply signal terminal configured to provide power to a pull-down control circuit, receives a first power supply signal VDD_O. The first power supply signal terminal of the shift register circuit SR<n+1>, i.e., the power supply signal terminal configured to provide power to a pull-down control circuit, receives a second power supply signal VDD_E.

According to an embodiment of the present disclosure, a connection component may further be provided in the gate driving circuit to repair a transmission path of the feedback signal as needed. This will be described below with reference to FIG. 7.

Figure 7:
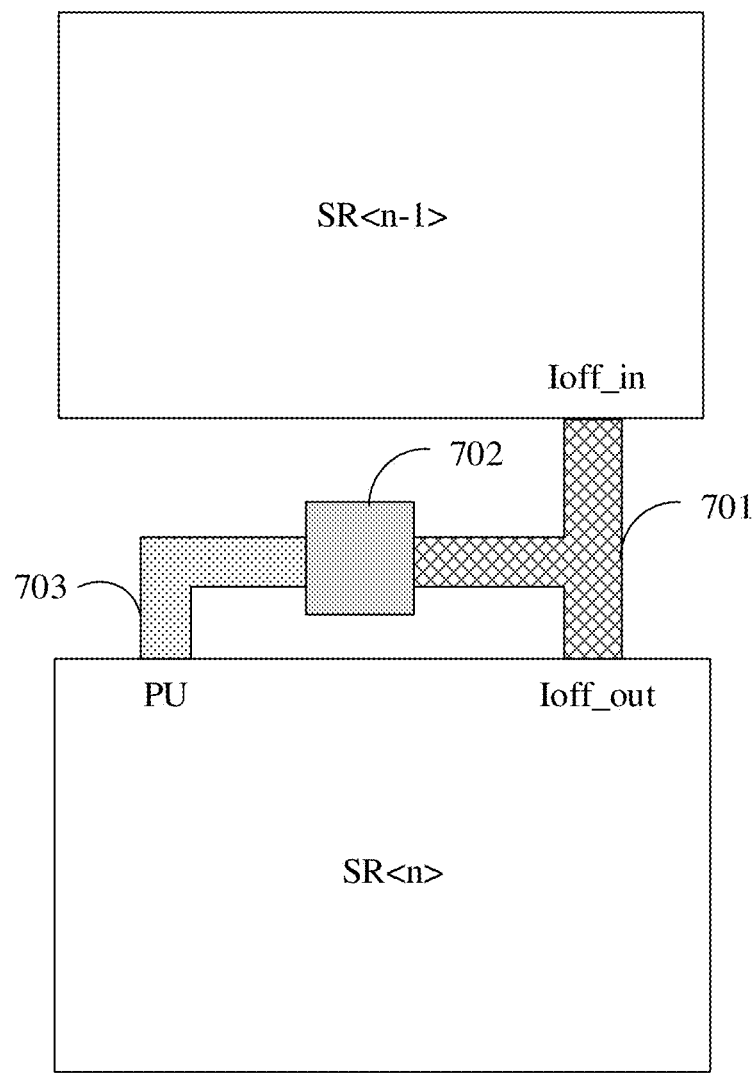
FIG. 7 illustrates a schematic diagram of wiring of a gate driving circuit according to an embodiment of the present disclosure.

FIG. 7 illustrates a schematic diagram of a wiring of a gate driving circuit according to an embodiment of the present disclosure, in which a portion unrelated to a connection component is omitted for the sake of brevity. A wiring pattern of FIG. 7 may be applied to the above gate driving circuit, for example, any of the gate driving circuits 400, 500, and 600 described above. As shown in FIG. 7, a shift register circuit SR<n> has a feedback circuit, a shift register circuit SR<n−1> has a pull-down control circuit, the shift register circuit SR<n> outputs a first feedback signal at a feedback output terminal Ioff_out, and the shift register circuit SR<n−1> receives the first feedback signal output by the shift register circuit SR<n> as a second feedback signal at a feedback input terminal Ioff_in.

A connection component 702 may be provided between a pull-up node PU and the feedback output terminal Ioff_out of the shift register circuit SR<n>. In FIG. 7, the feedback output terminal Ioff_out of the shift register circuit SR<n> having a feedback circuit is coupled to the feedback input terminal Ioff_in of the shift register circuit at the previous stage SR<n−1> having a pull-down control circuit through a first wire 701, and the pull-up node of the shift register circuit SR<n> is led out through a second wire 703, wherein the connection component 702 is provided between the first wire 701 and the second wire 703. The connection component 702 may be designed to couple the feedback output terminal Ioff_out to the pull-up node PU in a first state, so that a level at the pull-up node of the shift register circuit SR<n> is output as a first feedback signal to the shift register circuit SR<n−1>; and decouple the feedback output terminal Ioff_out from the pull-up node PU in a second state, so that the first feedback signal generated by the feedback circuit of the shift register circuit SR<n> is output to the shift register circuit SR<n−1>. For example, the connection component 702 comprises a pad which is able to be coupled by laser breakdown. The pad is in a decoupled state (the second state) when it is not broken down by light, and is in a coupled state (the first state) after being broken down by light. As an example, when the feedback circuit operates normally, the connection component 702 may be in a decoupled state (the second state), so that the pull-up node PU is maintained to be decoupled from the feedback output terminal Ioff_out, and the first feedback signal generated by the feedback circuit is output through the feedback output terminal Ioff_out to provide a stable feedback signal; and when the feedback circuit fails, the connection component 702 may enter into a coupled state (the first state), for example, by laser breakdown, so that the pull-up node PU is coupled to the feedback output terminal Ioff_out, and the level at the pull-up node PU is directly output as the first feedback signal at the feedback output terminal Ioff_out, which avoids the gate driving circuit from being unable to operate normally due to the failure of the feedback circuit, thereby improving the product yield.

The connection component 702 is provided, so that the level at the pull-up node PU of the shift register circuit SR<n> may be provided as a feedback signal to the shift register circuit at the previous stage SR<n−1> as needed, for example, when the feedback circuit of the shift register circuit SR<n> fails, which avoids the gate driving circuit from being unable to operate normally due to the failure of the feedback circuit, thereby improving the product yield.

An operation of a gate driving circuit according to an embodiment of the present disclosure will be described below with reference to FIG. 8B.

Figure 8B:
FIG. 8B illustrates an operational timing diagram of a gate driving circuit according to an embodiment of the present disclosure.

FIG. 8B illustrates an operational timing diagram of the gate driving circuit of FIGS. 6A and 6B. In FIG. 8B, a second reset signal Total Rst may be a frame reset signal at the beginning of each frame and is used to de-noise all rows before row scanning is performed per frame for a PU point. A first power supply signal VDD_O is inverted to a second power supply signal VDD_E, for example, both the first power supply signal VDD_O and the second power supply signal VDD_E may be flipped once every m frames, so as to reduce a forward pressure of transistors in a pull-down circuit, where m is an integer greater than or equal to 1. FIG. 8B illustrates a case where VDD_O is at a high level and VDD_E is at a low level, and therefore in time periods shown in FIG. 8B, a pull-down control circuit of a shift register circuit SR<n> operates and a pull-down control circuit of a shift register circuit SR<n+1> does not operate, and both a second pull-down node PD2<$n$+1> of the shift register circuit SR<n+1> and a first pull-down node PD1<$n$> of the shift register circuit SR<n> which are coupled with each other are commonly controlled by the pull-down control circuit of the shift register circuit SR<n>.

In an initial phase, the gate driving circuit is reset by the second reset signal Total Rst, since the first power supply signal VDD_O is at a high level, transistors T1 and T2 of the shift register circuit SR<n> are turned on, so that the first pull-down node PD1<$n$> is at a high level, and since PD1<$n$> is coupled to PD2<$n$+1>, the second pull-down node PD2<$n$+1> of the shift register circuit SR<n+1> is also at a high level.

In a time period t1, a first clock signal CLK1 is at a low level, and an input signal CR<n−1> received by the shift register circuit SR<n> at a signal input terminal is at a high level.

Since the input signal CR<n−1> is at a high level, transistors T14 and T15 of the shift register circuit SR<n> are turned on, a pull-up node PU<n> becomes a high level, and a capacitor C2 starts to be charged. Also, since the input signal CR<n−1> is at a high level, a transistor T23 of the shift register circuit SR<n> is turned on, to pull down the first pull-down node PD1<$n$> to a low level.

Since the pull-up node PU<n> is at a high level, transistors T18 and T19 of the shift register circuit SR<n> are turned on, so that the first clock signal CLK1 is introduced to a first signal output terminal and a second signal output terminal of the shift register circuit SR<n>, and since the first clock signal CLK1 is at a low level at this time, a first output signal OUT<n> and a second output signal CR<n> are both at a low level. Also, since the pull-up node PU<n> is at a high level, a transistor T6 of the shift register circuit SR<n> is turned on, and thereby a transistor T7 of the shift register circuit SR<n> is turned on, and a feedback signal Ioff<n> is at a high level. Also, since the pull-up node PU<n> is at a high level, transistors T3 and T4 of the shift register circuit SR<n> are turned on, so that the first pull-down node PD1<$n$> is pulled down to a low level, and since PD1<$n$> is coupled to PD2<$n$+1>, the second pull-down node PD2<$n$+1> of the shift register circuit SR<n+1> is also at a low level.

In a time period t2, the first clock signal CLK1 becomes a high level, and since the transistors T18 and T19 of the shift register circuit SR<n> are in a turn-on state at this time, the first output signal OUT<n> and the second output signal CR<n> of the shift register circuit SR<n> also become a high level. Since the level at the pull-up node PU<n> of the shift register circuit SR<n> further rises due to the bootstrap of the capacitor C2, the feedback signal Ioff<n> also rises accordingly.

The second output signal CR<n> of the shift register circuit SR<n> becomes a high level as an input signal of the shift register circuit SR<n+1>, so that a pull-up node PU<n+1> of the shift register circuit SR<n+1> becomes a high level and a capacitor C2 of the shift register circuit SR<n+1> starts to be charged. Also, since the input signal CR<n> is at a high level, a transistor T23 of the shift register circuit SR<n+1> is turned on, to pull down a first pull-down node PD1<$n$+1> to a low level. Since the pull-up node PU<n+1> is at a high level, transistors T18 and T19 of the shift register circuit SR<n+1> are turned on, so that a second clock signal CLK2 is introduced to a first signal output terminal and a second signal output terminal of the shift register circuit SR<n+1>, and since the second clock signal CLK2 is at a low level at this time, a first output signal OUT<n+1> and a second output signal CR<n+1> are both at a low level. Also, since the pull-up node PU<n+1> is at a high level, a transistor T6 of the shift register circuit SR<n+1> is turned on, and thereby a transistor T7 of the shift register circuit SR<n+1> is turned on, and a feedback signal Ioff<n+1> is at a high level.

In this time period, since the pull-up node PU<n> continues to be at a high level, the transistors T3 and T4 in the pull-down control circuit of the shift register circuit SR<n> are turned on, and since the feedback signal Ioff<n+1> is also at a high level, a transistor T5 in the pull-down control circuit of the shift register circuit SR<n> is also turned on, so that the first pull-down node PD1<n> of the shift register circuit SR<n> continues to be maintained at a low level, and thereby the second pull-down node PD2<n+1> coupled to the first pull-down node PD1<n> also continues to be maintained at a low level.

In a time period t3, the first clock signal CLK1 becomes a low level, and the second clock signal CLK2 becomes a high level.

Since the first clock signal CLK1 becomes a low level, the first output signal OUT<n> and the second output signal CR<n> of the shift register circuit SR<n> also become a low level. At this time, the capacitor C2 of the shift register circuit SR<n> is discharged, so that the level at the pull-up node PU<n> decreases to some extent, and the feedback signal Ioff<n> also decreases accordingly.

Since the second clock signal CLK2 becomes a high level, the first output signal OUT<n+1> and the second output signal CR<n+1> of the shift register circuit SR<n+1> also become a high level (since the transistors T18 and T19 of the shift register circuit SR<n+1> are in a turn-on state). At this time, since the level at the pull-up node PU<n+1> further rises due to the bootstrap of the capacitor C2 of the shift register circuit SR<n+1>, the feedback signal Ioff<n+1> also rises accordingly.

The second output signal CR<n+1> of the shift register circuit SR<n+1> becomes a high level as an input signal of the shift register circuit SR<n+2>, so that transistors T14 and T15 of the shift register circuit SR<n+2> are turned on, and thereby a pull-up node PU<n+2> also becomes a high level. Similarly to the process described above, since the pull-up node PU<n+2> is at a high level, a feedback signal Ioff<n+2> also becomes a high level, and transistors T18 and T19 of the shift register circuit SR<n+2> are turned on, and thereby the first clock signal CLK1 is introduced to a signal output terminal of the shift register circuit SR<n+2>, and since the first clock signal CLK1 is at a low level at this time, a first output signal OUT<n+2> and a second output signal CR<n+2> of the shift register circuit SR<n+2> are also at a low level.

In this time period, also since the pull-up node PU<n> and the feedback signal Ioff<n+1> continue to be at a high level, the transistors T3, T4, and T5 in the pull-down control circuit of the shift register circuit SR<n> continue to be turned on, so that the first pull-down node PD1<n> and the second pull-down node PD2<n+1> continue to be maintained at a low level.

In a time period t4, the first clock signal CLK1 becomes a high level, and the second clock signal CLK2 becomes a low level.

Since the first clock signal CLK1 becomes a high level, the first output signal OUT<n+2> and the second output signal CR<n+1> of the shift register circuit SR<n+2> also become a high level (since the transistors T18 and T19 in an output circuit of the shift register circuit SR<n+2> are in a turn-on state at this time). At this time, due to the bootstrap of the capacitor C2, the level at the pull-up node PU<n+2> further rises.

The second output signal CR<n+2> of the shift register circuit SR<n+2> becomes a high level as a first reset signal of the shift register circuit SR<n>, so that transistors T16 and T17 in a reset circuit of the shift register circuit SR<n> are turned on, to pull down the pull-up node PU<n> to a low level.

Also, the second output signal CR<n+2> of the shift register circuit SR<n+2> becomes a high level as an input signal of a shift register circuit SR<n+3>, so that transistors T14 and T15 of the shift register circuit SR<n+3> are turned on, and thereby a pull-up node PU<n+3> becomes a high level. Since PU<n+3> is at a high level, transistors T18 and T19 of the shift register circuit SR<n+3> are turned on, and the second clock signal CLK2 is introduced to a signal output terminal of the shift register circuit SR<n+3>, and since the second clock signal CLK2 is at a low level at this time, a first output signal OUT<n+3> and a second output signal CR<n+3> are also at a low level.

The second clock signal CLK2 becomes a low level and is delivered to the signal output terminal of the shift register circuit SR<n+1> (since the transistors T18 and T19 of the shift register circuit SR<n+1> are in a turn-on state at this time), so that the first output signal OUT<n+1> and the second output signal CR<n+1> become a low level. At this time, the capacitor C2 of the shift register circuit SR<n+1> is discharged, so that the level at the pull-up node PU<n+1> decreases to some extent, and the feedback signal Ioff<n+1> also decreases accordingly.

Since the pull-up node PU<n> is at a low level, the transistors T3 and T4 in the pull-down control circuit of the shift register circuit SR<n> are turned off, but since Ioff<n+1> is still at a high level at this time, the transistor T5 is still in a turn-on state, so that the first pull-down node PD1<n> is still at a low level, and thereby the second pull-down node PD2<n+1> coupled thereto also continues to be at a low level.

In a time period T5, the first clock signal CLK1 becomes a low level, and the second clock signal CLK2 becomes a high level.

Similarly to the process described above, since the first clock signal CLK1 becomes a low level, the first output signal OUT<n+2> and the second output signal CR<n+2> of the shift register circuit SR<n+2> also become a low level. Since the second clock signal CLK2 becomes a high level, the first output signal OUT<n+3> and the second output signal CR<n+3> of the shift register circuit SR<n+3> also become a high level.

The second output signal CR<n+3> of the shift register circuit SR<n+3> becomes a high level as a first reset signal of the shift register circuit SR<n+1>, so that the pull-up node PU<n+1> of the shift register circuit SR<n+1> is pulled down to a low level, and the feedback signal Ioff<n+1> also becomes a low level accordingly. At this time, since the pull-up node PU<n> and the feedback signal Ioff<n+1> are both at a low level, the transistors T3, T4 and T5 in the pull-down control circuit of the shift register circuit SR<n> are all turned off, and since the first power supply signal VDD_O is at a high level, the transistors T1 and T2 are turned on, to pull up the first pull-down node PD1<n> to a high level, so that the second pull-down node PD2<n+1> is also pulled up to a high level, to continuously pull down the signal output terminals of the shift register circuits SR<n> and SR<n+1>.

An example of an operational timing in a case where the first power supply signal VDD_O is at the high level and the second power supply signal VDD_E is at a low level is described above. In this case, the pull-down control circuit of the shift register circuit SR<n+1> does not operate, the pull-down control circuit of the shift register circuit SR<n> operates, and the pull-down nodes (PD1<n> and PD2<n+1>) of the shift register circuits at the two stages SR<n> and SR<n+1> are commonly controlled by the pull-down control circuit of the shift register circuit SR<n>. The pull-down circuit of the shift register circuit SR<n> is commonly controlled by the feedback signal Ioff<n+1> (or PU<n+1>) and PU<n>, and when Ioff<n+1> (or PU<n+1>) and PU<n> are both at a low level, that is, when the shift register circuits at the two stages SR<n+1> and SR<n> are both reset completely, PD1<n> is pulled up by the pull-down control circuit of the shift register circuit SR<n> to a high level, and correspondingly PD2<n+1> is also pulled up to a high level, to continuously pull down the output signals OUT<n> and OUT<n+1> of the shift register circuits at the two stages SR<n+1> and SR<n>.

In a case where the first power supply signal VDD_O is at a low level and the second power supply signal VDD_E is at a high level, the gate driving circuit of FIGS. 6A and 6B has a similar operational timing. In this case, the pull-down control circuit of the shift register circuit SR<n> does not operate, the pull-down control circuit of the shift register circuit SR<n+1> operates, the pull-down nodes (PD2<n> and PD1<n+1>) of the shift register circuits at the two stages SR<n> and SR<n+1> are commonly controlled by the pull-down control circuit of the shift register circuit SR<n+1>, and the pull-down control circuit of the shift register circuit SR<n> is commonly controlled by the feedback signal Ioff<n+1> (or PU<n+1>) and PU<n>. When Ioff<n+1> (or PU<n+1>) and PU<n> are both at a low level, that is, when the shift register circuits at the two stages SR<n+1> and SR<n> are reset completely, PD1<n+1> is pulled up by the pull-down control circuit of the shift register circuit SR<n+1> to a high level, and PD1<n> is also pulled up to a high level accordingly, to continuously pull down the output signals OUT<n+1> and OUT<n> of the shift register circuits at the two stages SR<n+1> and SR<n>, which will not be described in detail here.

In addition, although the operational timing is described above with reference to the gate driving circuit of FIGS. 6A and 6B, it will be apparent to those skilled in the art that other gate driving circuits according to the embodiments of the present disclosure, for example, the gate driving circuits described with reference to FIGS. 4A, 4B, 5A and 5B have similar operational timings, which will not be described in detail here.

Figure 9:
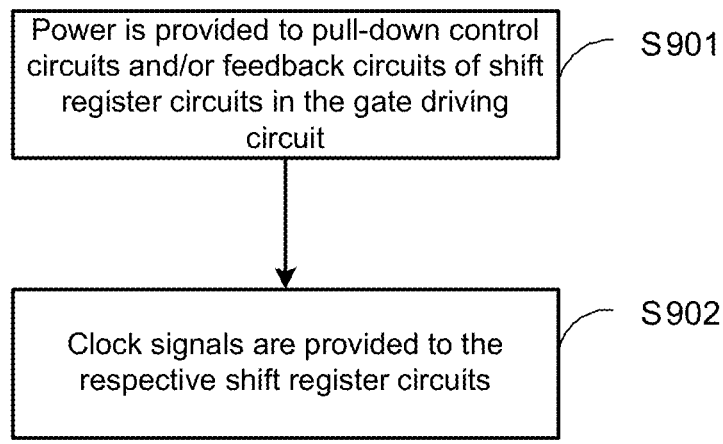
FIG. 9 illustrates a schematic flowchart of a method for driving a gate driving circuit according to an embodiment of the present disclosure.

FIG. 9 illustrates a schematic flowchart of a method 900 for driving a gate driving circuit according to an embodiment of the present disclosure, wherein the driving method 900 may be applied to any of the gate driving circuits described above, for example, any of the gate driving circuits 400, 500 and 600.

In step S901, power is provided to pull-down control circuits and/or feedback circuits of shift register circuits in the gate driving circuit. For example, for the gate driving circuit 400 or 500 described above, pull-down control circuits or feedback circuits of various shift register circuits may be powered by the same power supply voltage, for example, the pull-down control circuits and the feedback circuits are coupled to the same power supply signal terminal VDD. Of course, the pull-down control circuits and the feedback circuits may also be powered by different power supply voltages. For the gate driving circuit 600 described above, two shift register circuits in a group of shift register circuits may be powered by a pair of power supply signals which are inverted to each other, for example, as shown in FIG. 8B, a first power supply signal VDD_O may be provided to a pull-down control circuit of one shift register circuit from the group of shift register circuits, and a second power supply signal VDD_E may be provided to a pull-down control circuit of the other shift register circuit from the group of shift register circuits, wherein in a first time period, the first power supply signal VDD_O is at a high level, and the second power supply signal VDD_E is at a low level; and in a second time period, the first power supply signal VDD_O is at a low level, and the second power supply signal is at a high level.

In step S902, clock signals are provided to the respective shift register circuits. For example, as described above, two clock signals CLK1 and CLK2 which are inverted to each other may be used to be provided to two shift register circuits in each group of shift register circuits respectively. As shown in FIGS. 4A to 6B, the first clock signal CLK1 may be provided to the clock signal terminals of the shift register circuit SR<n>, SR<n+2>, SR<n+4> . . . , and the second clock signal CLK2 may be provided to the clock signal terminals of the shift register circuits SR<n+1>, SR<n+3>, SR<n+5> . . . , wherein the first clock signal CLK1 and the second clock signal CLK2 may be inverted to each other, as shown in FIG. 8B. However, it should be apparent to those skilled in the art that the embodiments of the present disclosure are not limited thereto, and other numbers, for example, 4 or 6 etc., of clock signals may be used as needed, and waveforms of the clock signals may also be selected as needed.

Although the steps of the method are described above in a specific order, it should be apparent to those skilled in the art that an execution order of the steps of the method according to the present disclosure is not limited thereto. For example, the execution order of the above steps S901 and S902 may be interchanged or may be performed simultaneously.

Figure 10:
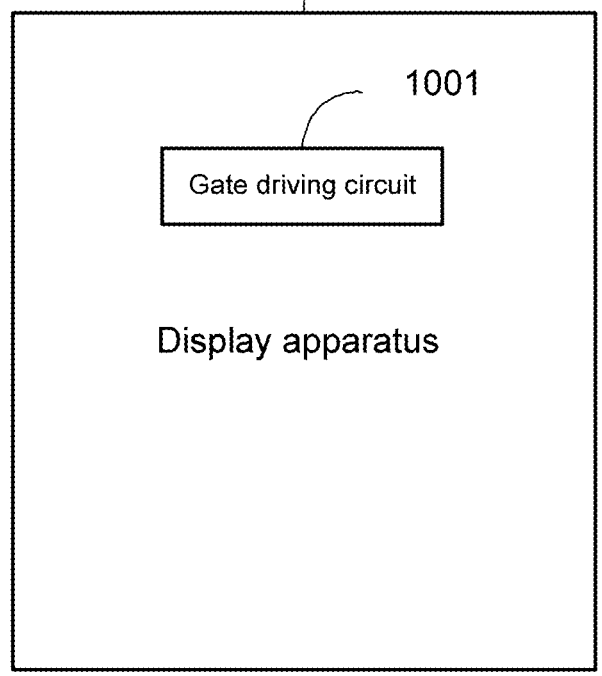
FIG. 10 illustrates a schematic block diagram of a display apparatus according to an embodiment of the present disclosure.

FIG. 10 illustrates a schematic block diagram of a display apparatus according to an embodiment of the present disclosure. As shown in FIG. 10, the display apparatus 1000 may comprise a gate driving circuit 1001 according to an embodiment of the present disclosure. The gate driving circuit 1001 may be implemented by the gate driving circuit described above, for example, any of the gate driving circuits 400, 500 and 600. The display apparatus 1000 according to the embodiment of the present disclosure may be any product or component having a display function, for example, an electronic paper, a mobile phone, a tablet computer, a television, a display, a notebook computer, a digital photo frame, a navigator, etc.

According to an embodiment of the present disclosure, the shift register circuit comprises at least one of a pull-down control circuit or a feedback circuit, which enables the shift register circuit to be able to provide a feedback signal and/or receive a feedback signal and control a pull-down node according to the feedback signal. This makes it possible for the shift register circuits at two stages to share one pull-down control circuit to control pull-down nodes, thereby simplifying a structure of the circuit. According to an embodiment of the present disclosure, there is provided a gate driving circuit comprising such shift register circuits, in which a shift register circuit having a pull-down control circuit is provided to be followed by the shift register circuit at the next stage having a feedback circuit, and a pull-down node of the shift register circuit having the pull-down control circuit is coupled to a pull-down node of the shift register circuit at the previous or next stage, so that the shift register circuit having the pull-down control circuit may control the pull-down nodes of the shift register circuits at the two stages, which realizes sharing the pull-down control circuit and the pull-down node. Compared with the related art, it is not necessary to provide separate pull-down control circuits for respective pull-down nodes of all shift register circuits, which simplifies a structure of the gate driving circuit.

According to an embodiment of the present disclosure, the shift register circuit may comprise both a pull-down control circuit and a feedback circuit and has two pull-down nodes, so that pull-down nodes of each shift register circuit may not only be controlled by a pull-down circuit of another shift register circuit, but also may control pull-down nodes of another shift register circuit. According to an embodiment of the present disclosure, there is provided a gate driving circuit comprising such shift register circuits, which realizes sharing a pull-down control circuit and pull-down nodes of the shift register circuits at two adjacent stages by step-by-step feedback and cross-connection of the pull-down nodes, while reducing a forward turn-on time of transistors in the pull-down control circuit by switching a power supply signal of the pull-down control circuit, thereby improving the service life. Further, since only one type of shift register circuits are needed, it is more convenient for industrial implementation.

According to an embodiment of the present disclosure, the feedback circuit may directly output a level at a pull-down node as a feedback signal, which makes it possible to obtain a relatively simple structure of the circuit; and the feedback circuit may further comprise a feedback sub-circuit, a first pull-down sub-circuit, and a second pull-down sub-circuit, so that the feedback circuit may provide a relatively stable feedback signal.

According to an embodiment of the present disclosure, a feedback signal generated by a shift register circuit based on a level at a pull-up node may be provided back to the interior of the shift register circuit, which may make the level at the pull-up node more stable, thereby providing a relatively stable feedback signal. For example, a feedback output terminal is coupled between the second pull-down sub-circuit and the third pull-down sub-circuit, which may prevent electric leakage of the pull-up node through the second pull-down sub-circuit, to stabilize the level at the pull-up node; and the feedback output terminal is further coupled to an input circuit and/or a reset circuit, which may further stabilize the level at the pull-up node.

According to an embodiment of the present disclosure, a connection component is provided between the pull-up node and the feedback output terminal of the shift register circuit in terms of wiring, so that when needed, for example, when the feedback circuit fails, the connection component enters into a connection state, so that the pull-up node of the shift register circuit may be directly coupled to the feedback output terminal, which avoids the gate driving circuit from being unable to operate normally due to the failure of the feedback circuit, thereby improving the product yield.

The embodiments of the present disclosure provide at least a shift register circuit, a gate driving circuit and a method for driving the same, and a display apparatus. The shift register circuit is configured to comprise at least one of a feedback circuit or a pull-down control circuit, which enables controlling levels at pull-down nodes of the shift register circuits at two stages using one pull-down control circuit, thereby simplifying a structure of the circuit.

The purposes, technical solutions and beneficial effects of the embodiments of the present disclosure are further described in detail in the specific embodiments described above. It is to be understood that the above description is merely specific embodiments of the embodiments of the present disclosure, and are not used to limit the present disclosure. Any modifications, equivalent substitutions, improvements, etc. which are made within the spirit and scope of the present disclosure are intended to be included within the protection scope of the present disclosure.

We claim:

1. A shift register circuit, comprising:
   an input circuit electrically coupled to a pull-up node of the shift register circuit, and configured to receive an input signal and output the input signal to the pull-up node;
   an output circuit electrically coupled to a signal output terminal and the pull-up node of the shift register circuit, and configured to receive a clock signal and provide an output signal at the signal output terminal based on the clock signal under control of a level at the pull-up node;
   a pull-down circuit electrically coupled to the signal output terminal and a pull-down node of the shift register circuit, and configured to pull down a level at the signal output terminal under control of a level at the pull-down node; and
   at least one of:
      a feedback circuit electrically coupled to the pull-up node, and configured to output a first feedback signal based on the level at the pull-up node; or
      a pull-down control circuit electrically coupled to the pull-up node and the pull-down node, and configured to receive a second feedback signal and control the level at the pull-down node under control of the level at the pull-up node and the second feedback signal.

2. The shift register circuit according to claim 1, wherein the pull-down control circuit is included and comprises:
   a first control sub-circuit electrically coupled to the pull-up node and the pull-down node, and configured to control the level at the pull-down node under control of the level at the pull-up node; and
   a second control sub-circuit electrically coupled to the first control sub-circuit, wherein the second control sub-circuit has a feedback input terminal, and is configured to receive the second feedback signal at the feedback input terminal and control turn-on and turn-off of the first control sub-circuit according to the second feedback signal.

3. The shift register circuit according to claim 1, wherein the shift register circuit comprises one of the feedback circuit or the pull-down control circuit, and the pull-down node comprises a first pull-down node.

4. The shift register circuit according to claim 1, wherein:
   the shift register circuit comprises the feedback circuit and the pull-down control circuit;
   the pull-down node comprises a first pull-down node and a second pull-down node;
   the pull-down circuit is electrically coupled to the signal output terminal, the first pull-down node and the second pull-down node, and is configured to pull down the level at the signal output terminal under control of levels at the first pull-down node and the second pull-down node; and
   the pull-down control circuit is electrically coupled to the pull-up node and the first pull-down node, and is configured to receive the second feedback signal and control the level at the first pull-down node under control of the level at the pull-up node and the second feedback signal.

5. The shift register circuit according to claim 4, wherein the pull-down control circuit comprises a first control sub-circuit and a second control sub-circuit, and wherein:

the first control sub-circuit comprises a first transistor, a second transistor, a third transistor, a fourth transistor and a capacitor, wherein:
the first transistor has a gate electrically coupled to a power supply signal terminal configured to provide a power supply signal, a first electrode electrically coupled to the gate, and a second electrode electrically coupled to a gate of the second transistor;
the second transistor has the gate electrically coupled to the second electrode of the first transistor, a first electrode electrically coupled to the power supply signal terminal, and a second electrode electrically coupled to the first pull-down node;
the third transistor has a gate electrically coupled to the pull-up node, a first electrode electrically coupled to the second electrode of the second transistor, and a second electrode electrically coupled to a reference signal terminal configured to provide a reference signal;
the fourth transistor has a gate electrically coupled to the pull-up node, a first electrode electrically coupled to the second electrode of the first transistor, and a second electrode electrically coupled to the reference signal terminal; and
the capacitor is electrically coupled between the gate and the second electrode of the second transistor, and
the second control sub-circuit comprises a fifth transistor, wherein the fifth transistor has a gate electrically coupled to the feedback input terminal, a first electrode electrically coupled to the second electrode of the first transistor, and a second electrode electrically coupled to the reference signal terminal.

6. The shift register circuit according to claim 4, wherein the feedback circuit comprises a feedback sub-circuit, a first pull-down sub-circuit, and a second pull-down sub-circuit, and wherein:
the feedback sub-circuit comprises a sixth transistor and a seventh transistor, wherein the sixth transistor has a gate electrically coupled to the pull-up node, a first electrode electrically coupled to a power supply signal terminal configured to provide a power supply signal, and a second electrode electrically coupled to a gate of the seventh transistor, and the seventh transistor has the gate electrically coupled to a first electrode thereof, and a second electrode electrically coupled to a feedback output terminal;
the first pull-down sub-circuit comprises an eighth transistor and an eleventh transistor, wherein the eighth transistor has a gate electrically coupled to the first pull-down node, a first electrode electrically coupled to the second electrode of the sixth transistor, and a second electrode electrically coupled to a reference signal terminal configured to provide a reference signal, and the eleventh transistor has a gate electrically coupled to the second pull-down node, a first electrode electrically coupled to the second electrode of the sixth transistor, and a second electrode electrically coupled to the reference signal terminal; and
the second pull-down sub-circuit comprises a ninth transistor and a twelfth transistor, wherein the ninth transistor has a gate electrically coupled to the first pull-down node, a first electrode electrically coupled to the pull-up node, and a second electrode electrically coupled to the reference signal terminal, and the twelfth transistor has a gate electrically coupled to the second pull-down node, a first electrode electrically coupled to the pull-up node, and a second electrode electrically coupled to the reference signal terminal.

7. The shift register circuit according to claim 6, wherein the feedback circuit further comprises a third pull-down sub-circuit, the third pull-down sub-circuit comprising a tenth transistor and a thirteenth transistor, wherein:
the tenth transistor has a gate electrically coupled to the first pull-down node, a first electrode electrically coupled to the second electrode of the ninth transistor and the feedback output terminal, and a second electrode electrically coupled to the reference signal terminal; and
the thirteenth transistor has a gate electrically coupled to the second pull-down node, a first electrode electrically coupled to the second electrode of the twelfth transistor and the feedback output terminal, and a second electrode electrically coupled to the reference signal terminal.

8. The shift register circuit according to claim 1, wherein the feedback circuit is included and comprises:
a feedback sub-circuit electrically coupled to the pull-up node, wherein the feedback sub-circuit has a feedback output terminal, and is configured to generate the first feedback signal based on the level at the pull-up node and output the first feedback signal at the feedback output terminal;
a first pull-down sub-circuit electrically coupled to the feedback sub-circuit and the pull-down node, and configured to pull down the first feedback signal generated by the feedback sub-circuit under control of the level at the pull-down node; and
a second pull-down sub-circuit electrically coupled to the pull-up node and the pull-down node, and configured to pull down the level at the pull-up node under control of the level at the pull-down node.

9. The shift register circuit according to claim 8, wherein the feedback circuit further comprises a third pull-down sub-circuit, wherein the second pull-down sub-circuit is electrically coupled to a reference signal terminal configured to provide a reference signal through the third pull-down sub-circuit, and the third pull-down sub-circuit is electrically coupled to the pull-down node, and is configured to pull down a level at a node between the third pull-down sub-circuit and the second pull-down sub-circuit under control of the level at the pull-down node; and
the feedback output terminal is electrically coupled to the node between the third pull-down sub-circuit and the second pull-down sub-circuit.

10. The shift register circuit according to claim 9, wherein the input circuit comprises a fourteenth transistor and a fifteenth transistor, wherein the fourteenth transistor has a gate and a first electrode electrically coupled to a signal input terminal configured to provide an input signal, and a second electrode electrically coupled to a first electrode of the fifteenth transistor, and the fifteenth transistor has a gate electrically coupled to the gate of the fourteenth transistor, the first electrode electrically coupled to the second electrode of the fourteenth transistor, and a second electrode electrically coupled to the pull-up node; and
the feedback output terminal is electrically coupled to the second electrode of the fourteenth transistor and the first electrode of the fifteenth transistor.

11. The shift register circuit according to claim 9, further comprising a reset circuit comprising a sixteenth transistor and a seventeenth transistor, wherein:
the sixteenth transistor has a gate electrically coupled to a reset signal terminal configured to provide a reset signal, a first electrode electrically coupled to the pull-up node, and a second electrode electrically coupled to a first electrode of the seventeenth transistor;

the seventeenth transistor has a gate electrically coupled to the reset signal terminal, the first electrode electrically coupled to the second electrode of the sixteenth transistor, and a second electrode electrically coupled to the reference signal terminal; and the feedback output terminal is electrically coupled to the second electrode of the sixteenth transistor and the first electrode of the seventeenth transistor.

12. A gate driving circuit, comprising cascaded shift register circuits at N stages according to claim 1, wherein:

the shift register circuit at the $n^{th}$ stage receives an output signal from the shift register circuit at the $(n-1)^{th}$ stage as an input signal, and receives an output signal from the shift register circuit at the $(n+2)^{th}$ stage as a reset signal, where n and N are integers, $N \geq 4$, and $2 \leq n < N-2$;

for each shift register circuit having a pull-down control circuit, the shift register circuit at its next stage has a feedback circuit, and the shift register circuit having the pull-down control circuit receives a first feedback signal output from the feedback circuit of the shift register circuit at its next stage as a second feedback signal; and a pull-down node of the shift register circuit having the pull-down control circuit is electrically coupled to a pull-down node of the shift register circuit at its previous or next stage to form a group of shift register circuits.

13. The gate driving circuit according to claim 12, wherein:

the pull-down node comprises a first node; and one shift register circuit from the group of shift register circuits comprises a pull-down control circuit, and another shift register circuit from the group of shift register circuits comprises a feedback circuit.

14. The gate driving circuit according to claim 12, wherein:

the pull-down node comprises a first node and a second node;

each shift register circuit from the group of shift register circuits comprises a pull-down control circuit and a feedback circuit; and a first pull-down node of a first shift register circuit from the group of shift register circuits is electrically coupled to a second pull-down node of a second shift register circuit from the group of shift register circuits, and a second pull-down node of the first shift register circuit from the group of shift register circuits is electrically coupled to a first pull-down node of the second shift register circuit from the group of shift register circuits.

15. The gate driving circuit according to claim 14, wherein a pull-down control circuit of the first shift register circuit from the group of shift register circuits is configured to be powered by a first power supply signal, and a pull-down control circuit of the second shift register circuit from the group of shift register circuits is configured to be powered by a second power supply signal which is inverted to the first power supply signal.

16. The gate driving circuit according to claim 12, wherein the shift register circuit having the feedback circuit has a feedback output terminal configured to output the first feedback signal, and the gate driving circuit further comprises a connection component provided between the feedback output terminal and the pull-up node of the shift register circuit, and configured to electrically couple the feedback output terminal to the pull-up node in a first state, and electrically decouple the feedback output terminal from the pull-up node in a second state.

17. The gate driving circuit according to claim 16, wherein the connection component comprises a pad which is able to be electrically coupled by laser breakdown.

18. A display apparatus, comprising the gate driving circuit according to claim 12.

19. A method for driving the gate driving circuit according to claim 12, comprising:

providing power to pull-down control circuits and/or feedback circuits of the shift register circuits in the gate driving circuit, and providing clock signals to the shift register circuits.

20. The method according to claim 19, wherein the pull-down node comprises a first node and a second node and each shift register circuit in the group of shift register circuits comprises a pull-down control circuit and a feedback circuit, and wherein providing power to the pull-down control circuits of the shift register circuits comprises:

providing a first power supply signal to a pull-down control circuit of a first shift register circuit from the group of shift register circuits, and providing a second power supply signal to a pull-down control circuit of a second shift register circuit from the group of shift register circuits, wherein:

in a first time period, the first power supply signal is at a first level, and the second power supply signal is at a second level; and in a second time period, the first power supply signal is at the second level, and the second power supply signal is at the first level.

* * * * *